United States Patent [19]
Tsubosaki et al.

[11] Patent Number: 4,951,122
[45] Date of Patent: Aug. 21, 1990

[54] RESIN-ENCAPSULATED SEMICONDUCTOR DEVICE

[75] Inventors: Kunihiro Tsubosaki, Hino; Gen Murakami, Machida; Toshiyuki Sakuta, Hamura; Masamichi Ishihara, Hinode; Satoru Ito, Tokyo; Yasuo Mori, Ohme, all of Japan

[73] Assignee: Hitachi, Ltd., Tokyo, Japan

[21] Appl. No.: 199,538

[22] Filed: May 27, 1988

[30] Foreign Application Priority Data

| May 27, 1987 | [JP] | Japan | 62-128248 |
| Aug. 20, 1987 | [JP] | Japan | 62-206913 |
| Sep. 18, 1987 | [JP] | Japan | 62-234188 |

[51] Int. Cl.$^5$ .................................. H01L 23/48
[52] U.S. Cl. .............................. 357/72; 357/70
[58] Field of Search ....................... 357/72, 70, 68

[56] References Cited

U.S. PATENT DOCUMENTS

| 4,803,543 | 2/1989 | Imayoshi et al. | 357/72 |
| 4,884,124 | 11/1989 | Mori et al. | 357/72 |

FOREIGN PATENT DOCUMENTS

| 60-18145 | 9/1980 | Japan . |
| 60-11973 | 3/1985 | Japan . |
| 60-26505 | 6/1985 | Japan . |
| 61-218139 | 9/1986 | Japan . |
| 61-57347 | 12/1986 | Japan . |
| 61-292330 | 12/1986 | Japan . |

Primary Examiner—James W. Davie
Attorney, Agent, or Firm—Antonelli, Terry, Stout & Kraus

[57] ABSTRACT

The present invention relates to a technique in which the pellet fixing parts of a lead frame of the tabless type or the type having no die pads are molded in or coated with a resin beforehand in order to enhance the reliability of a resin-encapsulated IC having become important with enlargement in the size of the chip of a memory IC or the like and reduction in the size of a resin package, and a resin package structure in which the technique of the lead frame having no die pads is applied to flat packaging so as to lessen reflow cracks.

35 Claims, 23 Drawing Sheets

▣ ---- BONDING PAD
☐ ---- PROVING PAD

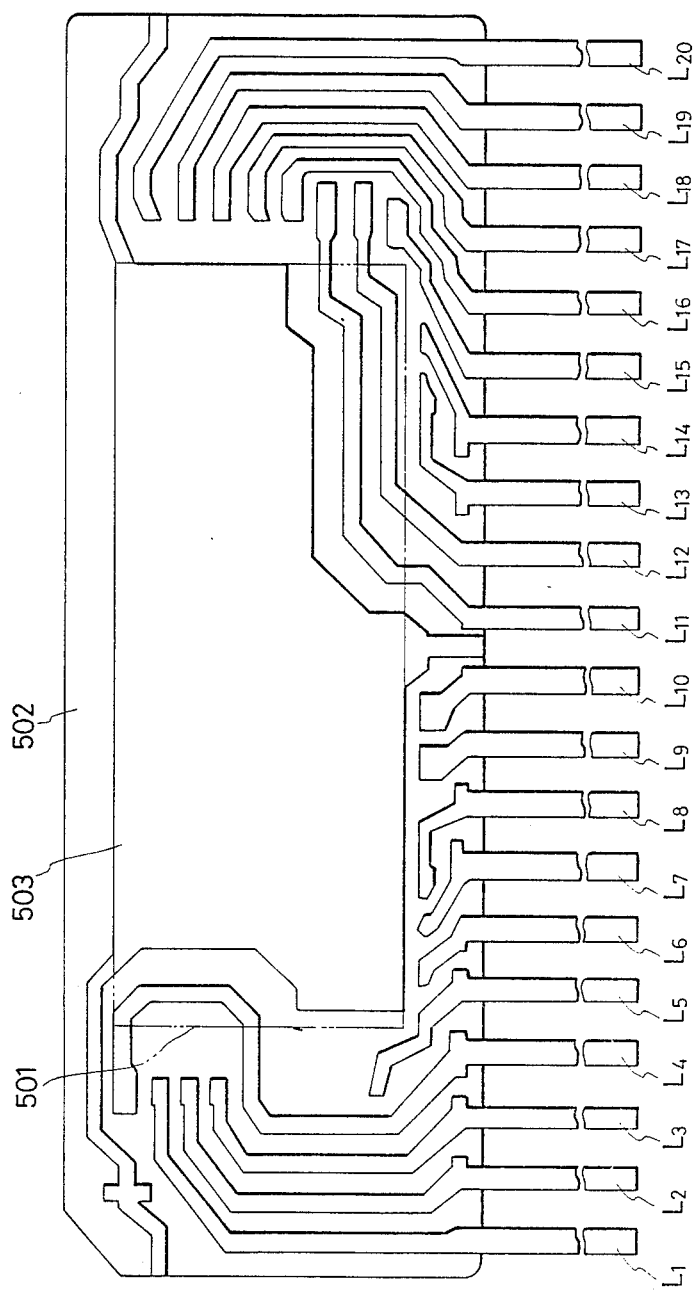

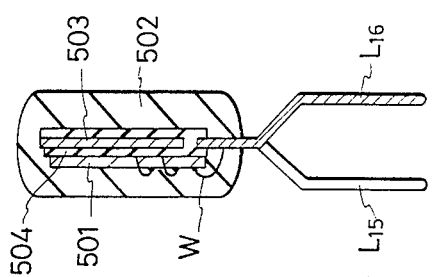
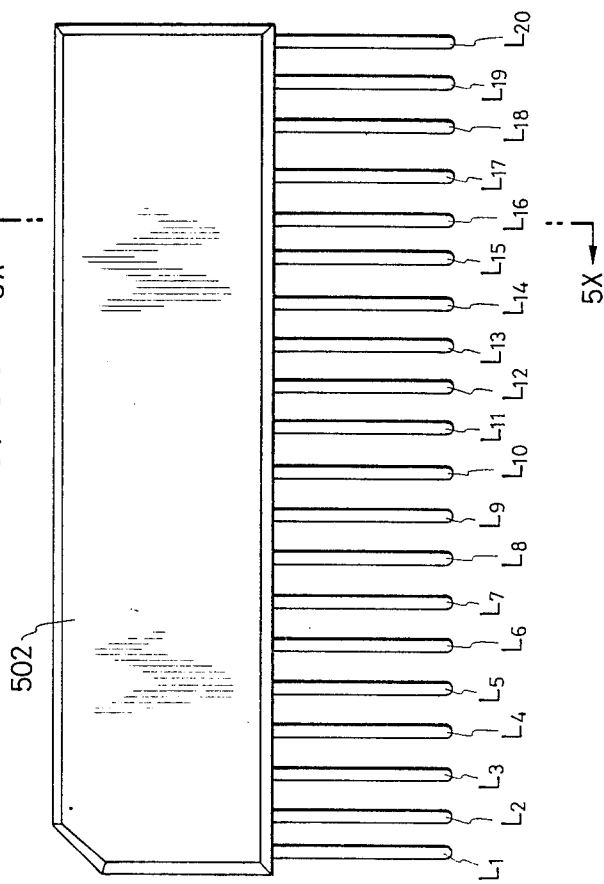
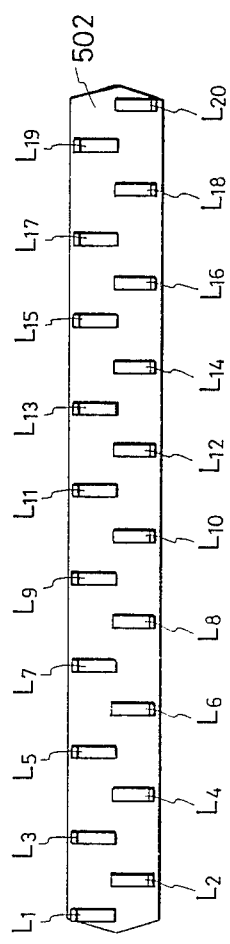

RESIN-ENCAPSULATED SEMICONDUCTOR DEVICE

BACKGROUND OF THE INVENTION

The present invention relates to a resin-encapsulated semiconductor device, and more particularly to techniques for improving the device in which a semiconductor pellet is mounted on a tabless lead frame by die bonding.

In U.S. patent application Ser. No. 845332 (filed Mar. 21, 1986), now abandoned, and the official gazette of Japanese patent application Laid-open No. 218139/1986, the inventors of the present application have previously proposed a resin-encapsulated semiconductor device which is shown as a sectional view in FIG. 1E, as a plan view in FIG. 1F and as a sectional view of essential portions in FIG. 1G.

The sectional view of FIG. 1E is taken along line 1X—1X in FIG. 1F, while the sectional view of FIG. 1G is taken along line 1Y—1Y in FIG. 1F.

As illustrated in these figures, the device 103 adopts a system wherein a semiconductor pellet (hereinbelow, simply termed "pellet") 101 is mounted on the plurality of leads 102a of a lead frame 102. More specifically, unlike the hitherto-conventional type in which the pellet 101 is secured onto a tab (sometimes called "bed" etc.) being usually square and serving to place the pellet on the central part thereof, the resin-encapsulated semiconductor device 103 is so constructed that the pellet 101 is mounted by die bonding on the lead frame 102 the pellet placing portion of which includes the plurality of leads 102a, and that a resin mold member 104 is formed by molding a resin.

At the step of the die bonding in this device 103, as illustrated in FIG. 1E, an insulating sheet 105 is bonded by a binder 105a, and the pellet 101 is fastened on the sheet 105 by a binder 106.

By the way, in FIG. 1F, numeral 107 designates bonding pads on the pellet 101, numeral 102b lead side bonding posts, and numeral 108 pieces of bonding wire.

The device 103 stated above forms a technique which is very advantageous for packaging a large-sized pellet. More specifically, even when a pellet becomes larger in size, a package for encasing the pellet cannot be enlarged because the size thereof is standardized. Therefore, with the conventional system wherein the pellet is mounted on the tab and wherein the pellet on the tab and inner leads extending toward the tab are connected by wire bonding, the leads which are buried in a resin mold member become shorter, to incur such a problem that the leads are more liable to come off the package. In contrast, with the device 103, the inner leads of the leads 102a are shaped to be very long, and the bonding strength thereof with the mold resin 104 is heightened. Accordingly, the strength of the leads against pulling-out and the resistance of the device to moisture can be enhanced, and even the large-sized pellet can be packaged without the aforementioned problem.

Further, the present invention relates to a semiconductor device, and more particularly to techniques which are effective when applied to a semiconductor device in which a chip is supported by leads.

One semiconductor device wherein a chip is encapsulated with a resin package consists in supporting the chip in such a way that some of leads are extended under the chip so as to come in from a side surface and to go out to another side surface. The leads and the chip are insulated by a polyimide film, and the chip is bonded onto the polyimide film with a binder containing, for example, a thermoplastic resin. The bonding between the polyimide film and the leads is effected with a binder containing, for example, a thermoplastic resin.

Still further, the present invention relates to a lead frame for a semiconductor device wherein a semiconductor chip is mounted on the semiconductor chip placing parts of the inner leads of a tabless lead frame, the inner leads and the semiconductor chip are electrically connected by pieces of bonding wire, and the resultant structure is encapsulated with a resin mold member. More particularly, it relates to techniques which can prevent the leakage (short-circuiting) among the individual inner leads mentioned above.

In a semiconductor device conforming to a conventional resin mold package system, a semiconductor chip is mounted on a tab. With this system, it has been very difficult to encase a large chip, for example, the chip of a dynamic random access memory (DRAM) of 4 megabits in a package of 300 mils. It has therefore been proposed that an insulating film for mounting the semiconductor chip is bonded to the semiconductor chip placing parts of the inner leads of a tabless lead frame and has the semiconductor chip mounted thereon.

BRIEF SUMMARY OF THE INVENTION

Regarding the device referred to first, the inventors made moisture-resistance reliability tests such as a pressure cooker test. Then, it has been found out that a leakage current in excess of a prescribed value flows due to the inferior electrical insulation between the leads 102a, so the device sometimes becomes defective.

As the cause of the inferior electrical insulation, it has been revealed that, when the device 103 is subjected to the pressure cooker test or the like, the binder (layer) 105a deteriorates to peel off at the boundary of the mold resin 104/the binder layer 105a and the boundary of the leads 102a/the binder layer 105a, whereupon moisture invades the peeling parts to incur inferior electrical conduction. Further, when the defect was thoroughly investigated, it has been considered to be ascribable to the two facts that, in the device 103, the boundary defined by the different kinds of substances (namely, the boundary of the mold resin 104/the binder layer 105a) is inevitably existent between the adjacent leads 102a, and that, since the bond strength of the binder 105a at this boundary is not always sufficient, the binder layer is prone to peel off under the conditions of a high temperature and a high humidity.

Further, a study was made of the aforementioned semiconductor device wherein the chip is supported by the leads. As a result, the following problem has been found out.

The binder for bonding the polyimide film to the leads is lower in the insulation resistance than the polyimide film etc. For this reason, a leakage current is prone to flow between the leads through the binder, so that noise develops in an input signal or an output signal.

Still further, regarding the semiconductor device of the system wherein the insulating film for mounting the semiconductor chip is bonded to the semiconductor chip placing parts of the inner leads of the tabless lead frame and has the semiconductor chip mounted thereon, it has been found that, since no consideration is given to the prevention of the leakage (short-circuiting)

between the individual inner leads, leakage (short-circuiting) currents sometimes flow between the individual inner leads through the boundary of the insulating film for mounting the semiconductor chip and the material of the resin mold member.

It is therefore an object of the present invention to provide a resin-encapsulated IC which is suited to flat packaging.

An object of the present invention is to provide, in resin encapsulation which employs a lead frame of the type having no die pads (of the tabless type), a resin-encapsulated IC manufacturing technique which is free from the lowering of a bonding accuracy ascribable to the dispersion of leads.

An object of the present invention is to provide a package structure in which the rear surface etc. of a resin package are not cracked by a thermal stress during flat packaging reflow.

An object of the present invention is to provide a resin-encapsulated IC which is suited to high-density packaging.

Another object of the present invention is to more enhance the moisture-resistance reliability of the above-stated resin-encapsulated semiconductor device advantageous for packaging the large-sized pellet while the merits of this device are kept.

Still another object of the present invention is to prevent the leakage current from flowing between the leads in the semiconductor device in which the chip is supported by the leads.

Yet another object of the present invention is to provide, in the lead frame for the semiconductor device in which the semiconductor chip is mounted on the semiconductor chip placing parts of the inner leads of the tabless lead frame, the inner leads and the semiconductor chip are electrically connected by pieces of bonding wire, and the resultant structure is encapsulated with the resin mold member, a technique which can prevent the leakage (short-circuiting) between the individual inner leads.

The above-mentioned and other objects and novel features of the present invention will become apparent from the description of this specification and the accompanying drawings.

Typical aspects of performance of the present invention will be briefly summarized below:

In the present invention, in case of mounting a pellet on a plurality of leads, a resin plate which is so shaped as to bury the plurality of leads therein is previously formed by a molding method such as injection molding, the pellet is fastened to the front surface of the resin plate with a bonding material and is connected by wire bonding, and the resultant structure is encapsulated with a resin.

Thus, owing to the shape in which the plurality of leads are respectively buried in the resin plate, the semiconductor device of the present invention does not include any boundary connecting the adjacent leads, unlike the resin-encapsulated semiconductor device proposed before. Accordingly, it is possible to avoid the defect ascribable to the leakage of current which is incurred for such a reason that the boundary defined by the different kinds of substances is inevitably existent between the adjacent leads, and the reliability of the semiconductor device is successfully enhanced more.

In a further aspect of performance of the present invention, in a semiconductor device wherein a chip is supported by some of leads, the parts of the leads to underlie the chip are buried in an insulating film, and the chip is bonded onto the insulating film.

According to the above expedient, there is no binder of low insulation resistance on the surfaces of the leads, and the parts of the leads under the chip are buried in the insulating film of high insulation resistance under the state under which they are isolated for the respective leads, so that leakage currents are prevented from flowing between the leads.

In a still further aspect of performance of the present invention, a lead frame for a semiconductor device wherein a semiconductor chip is mounted on the semiconductor chip placing parts of the inner leads of a tabless lead frame, the inner leads and the semiconductor chip are electrically connected by pieces of bonding wire, and the resultant structure is encapsulated with a resin mold member, consists in that the semiconductor chip placing parts of the individual inner leads are partially or wholly subjected to an insulating treatment.

According to the above expedient, owing to the partial or whole insulating treatment of the semiconductor chip placing parts of the individual inner leads, leakage (short-circuiting) currents do not flow between the individual inner leads through the boundary of an insulating film for mounting the semiconductor chip (this insulating film is not used in the present invention) and the resin mold member, and hence, the leakage (short-circuiting) between the individual inner leads can be prevented.

In another aspect of performance of the present invention, the concept of a lead frame of the type having no die pads (namely, of the tabless type) is applied to a resin-encapsulated IC of the flat packaging type, thereby to reduce the reflow cracks of the lower surface of a resin mold member.

In detail, in a semiconductor integrated circuit device wherein an integrated circuit semiconductor chip has its rear surface fastened on a large number of inner leads, the inner leads and a large number of bonding pads on a front principal surface of the chip are electrically connected by a large number of pieces of bonding wire, and the inner leads, the chip and the pieces of bonding wire are thereafter molded in a resin; a large number of outer leads continuous to the inner leads are protruded from side surfaces of the resin-molded assembly and are shaped to be suitable for flat packaging.

In more detail, a semiconductor device according to the present invention comprises:

an oblong and flat semiconductor chip which has first and second principal surfaces;

a very large number of elements which are formed on the first principal surface;

a large number of bonding pads which are provided near each of a pair of shorter sides on the first principal surface;

a large number of inner leads which extend substantially within a plane under and near the second principal surface and parallel to this principal surface, the inner leads including first, second, third and fourth sets each of which has a plurality of inner leads, the first set of inner leads entering under the chip from a first longer side of the chip, and projecting out of the chip from the first shorter side of the chip without intersecting any other inner lead, the second set of inner leads entering under the chip from the first longer side of the chip, and projecting out of the chip from the second shorter side of the chip without intersecting any other inner lead, the third set of inner leads entering under the chip from a second longer side of the chip, and projecting out of the chip from the first shorter side of the chip without intersecting any other inner lead, the fourth set of inner leads entering under the chip from the second longer side of the chip, and projecting out of the chip from the second shorter side of the chip without intersecting any other inner lead, the second principal surface of the chip and first principal surfaces of the inner leads being fastened through an insulating layer;

a large number of pieces of bonding wire by which the large number of bonding pads near the first and second shorter sides and parts of the inner leads protruding from the first and second shorter sides are electrically connected near each of the first and second shorter sides;

a resin mold member in which the chip, the inner leads and the pieces of bonding wire are substantially wholly molded, the mold member being substantially in a shape of a thick rectangular parallelepiped, and having first and second longer side surfaces, first and second shorter side surfaces, and first and second principal surfaces, the chip being buried in a substantially central part of the mold member in such a manner that the each longer side surface of the mold member and the corresponding longer side of the chip, the each shorter side surface of the mold member and the corresponding shorter side of the chip, and the each principal surface of the mold member and the corresponding principal surface of the chip form pairs and lie in parallel and in proximity, respectively;

a first set of outer leads in a large number, which are respectively continuous to the first and second sets of inner leads at the first longer side surface of the mold member, and which protrude out; and a second set of outer leads in a large number, which are respectively continuous to the third and fourth sets of inner leads at the second longer side surface of the mold member, and which protrude out, the first, second, third and fourth sets of inner leads and the first and second sets of outer leads being formed, in effect, of a single thin metal plate, the first set of outer leads having their protruding points from the first longer side surface arrayed substantially in a straight line in a longitudinal direction of the first longer side surface, the outer leads being bent substantially in arcs from their arrayed positions and along an outer surface of the mold member in such a manner that fore ends of the outer leads turn toward the second principal surface of the mold member near the first longer side surface, thereby permitting the resin-molded assembly to be flat-packaged at outer surfaces of lower parts of the arc-shaped outer leads, the second set of outer leads having their protruding points from the second longer side surface arrayed substantially in a straight line in a longitudinal direction of the second longer side surface, the outer leads being bent substantially in arcs from their arrayed positions and along an outer surface of the mold member in such a manner that fore ends of the outer leads turn toward the second principal surface of the mold member near the second longer side surface, thereby permitting the resin-molded assembly to be flat-packaged at outer surfaces of lower parts of the arc-shaped outer leads.

BRIEF DESCRIPTION OF THE DRAWINGS

FIG. 5B is a side view showing the shapes of leads in the ZIP type package shown in FIG. 5A;

FIG. 5C is a side view showing the external appearance of the ZIP type package shown in FIG. 5A;

FIG. 5D is a bottom view of the ZIP type package shown in FIG. 5C;

FIG. 5E is a sectional view taken along line 5X—5X in FIG. 5C;

DETAILED DESCRIPTION (1) Embodiment 1:

Now, the first embodiment of the present invention will be described with reference to the drawings.

Figure 1A:
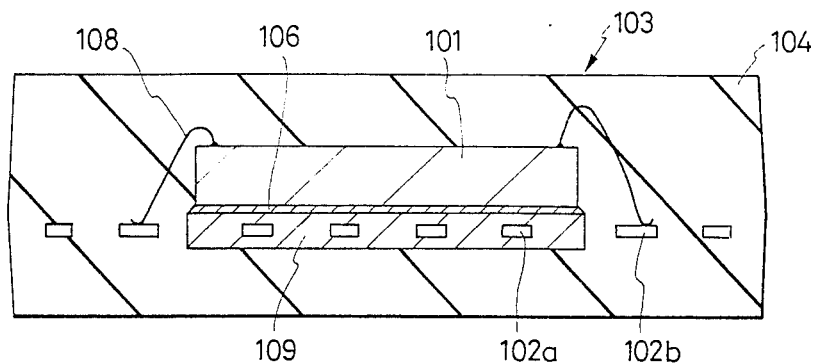
FIG. 1A is a sectional view of essential portions showing an example of the first embodiment of the present invention.
Figure 1B:
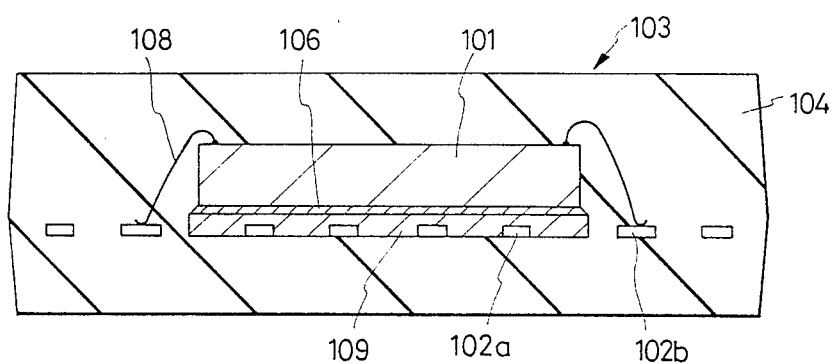
FIG. 1B is a sectional view of essential portions showing another example of the first embodiment of the present invention.
Figure 1C:
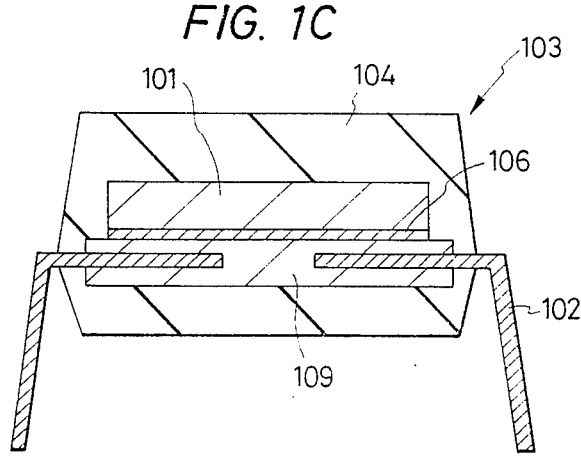
FIG. 1C is a constructional sectional view of a semiconductor device showing the first embodiment of the present invention.
Figure 1D:
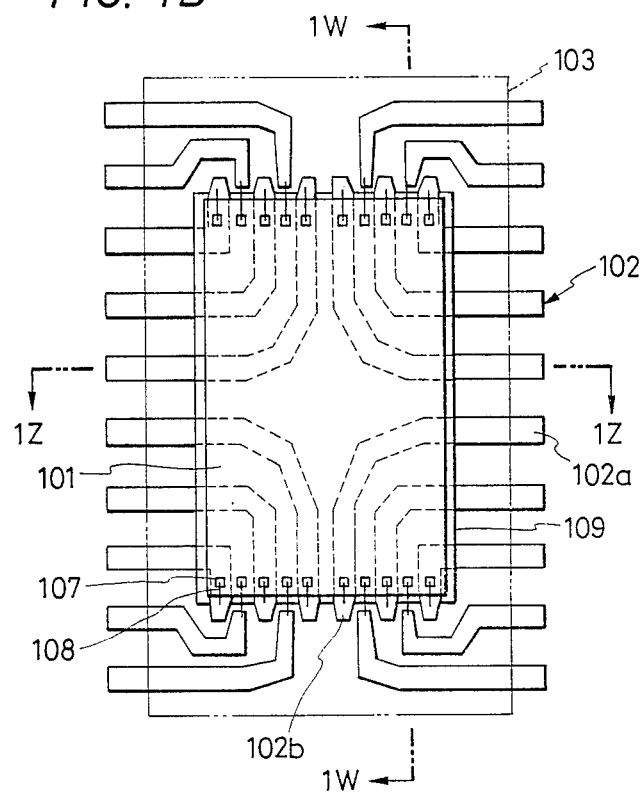
FIG. 1D is a plan view for explaining the relationship between a pellet and leads in the semiconductor device of the first embodiment of the present invention.
Figure 1E:
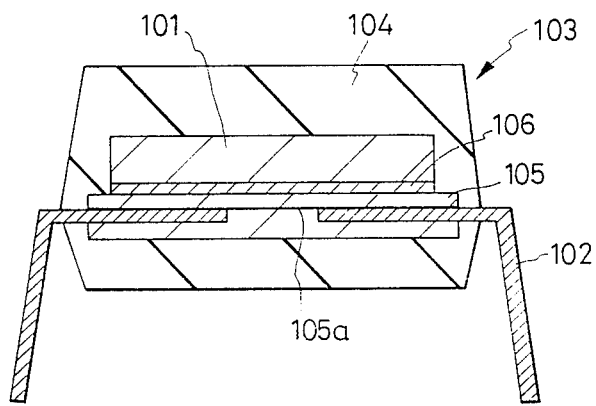
FIG. 1E is a constructional sectional view of a semiconductor device showing a prior-art example.
Figure 1F:
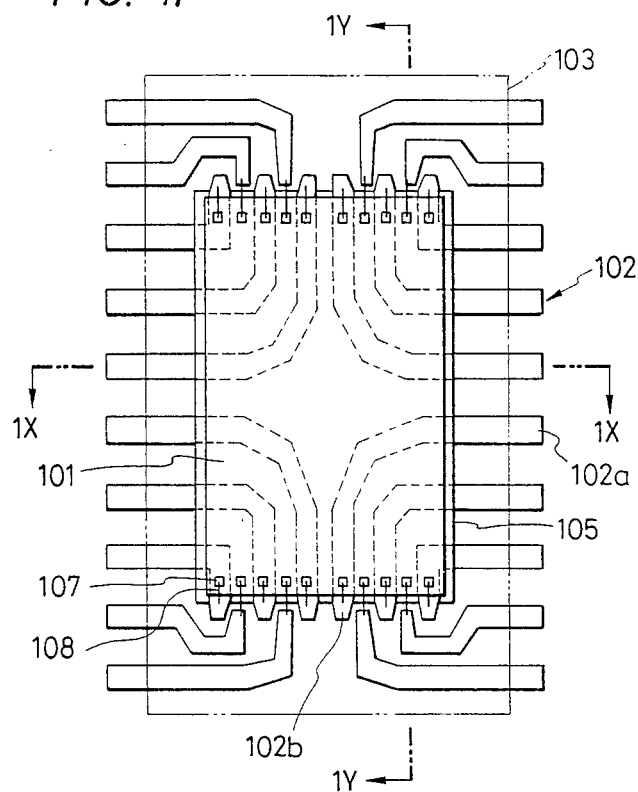
FIG. 1F is a plan view for explaining the relationship between a pellet and leads in the semiconductor device of the prior-art example.
Figure 1G:
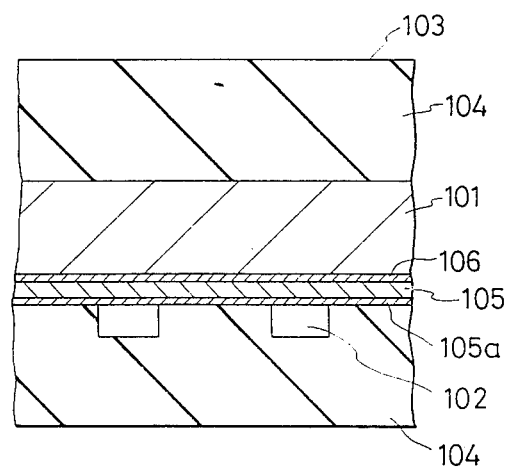
FIG. 1G is a sectional view taken along line 1Y—1Y in FIG. 1F.

FIG. 1D is a plan view showing the relationship between a pellet and leads in a semiconductor device illustrative of an example of the embodiment of the present invention, FIG. 1C is a sectional view of the whole construction of the semiconductor device in the embodiment of the present invention as taken along line 1Z—1Z in FIG. 1D, and FIG. 1A is a sectional view of the essential portions of the semiconductor device in the embodiment of the present invention as taken along line 1W—1W in FIG. 1D.

As shown in FIGS. 1A and 1D, in the example of the embodiment of the present invention, a pellet placing resin layer 109 is so formed that a plurality of leads 102a are respectively buried therein.

The resin layer 109 can be formed by, for example, injection molding. More specifically, a lead frame 102 in a configuration shown in FIG. 1D, having neither tabs nor tab leads, is put in a metal mold, and a resin is injected into the metal mold.

The resin layer 109 suffices when formed in a zone in which a pellet 101 is to be placed. In the example shown in FIG. 1A, this resin layer 109 is made of a resin plate having a proper thickness.

After the formation of the resin plate 109, as illustrated in FIGS. 1A and 1D, the pellet 101 is fixed onto the resin plate 109 with a binder 106 (by die bonding), and the pellet 101 and the leads are subsequently subjected to wire bonding by pieces of bonding wire 108.

The leads 102a extend in rear of the pellet 101 which has bonding pads 107 arrayed along the two sides thereof, and they protrude their fore ends 102b from the pellet sides along which the pads 107 are arrayed. The wire bonding is performed by connecting the fore ends 102b of the leads 102a and the bonding pads 107 of the pellet 101 by means of the pieces of bonding wire 108.

After the wire bonding, the resulting pellet assembly is put in a metal mold and is molded in a resin by, for example, transfer molding, thereby to form a resin mold member 104.

As the molding resin for forming the resin mold member 104, there is mentioned an epoxy resin or a silicone rubber-modified epoxy resin by way of example.

As the resin for forming the resin plate 109, the same resin as the aforementioned molding resin may be used, and a thermoplastic synthetic resin such as polyphenylene sulfide (PPS), polysulfone, or polyether sulfone may well be employed.

Of course, the molding resin or the resin plate forming resin may well be doped with a filler and other various additives.

FIG. 1B shows another example of the first embodiment of the present invention. In the example shown in FIG. 1A, the leads 102a are buried in the resin plate 109. In this example of FIG. 1B, a resin layer 109 for placing the pellet 101 thereon is formed in a shape in which the front surface and both the side surfaces of each lead 102a are covered as illustrated in the figure.

In this case, a boundary is defined between the resin layer 109 and the resin mold member 104. As the material for forming the resin layer 109, therefore, it is important to select a material exhibiting a good adhesive property with the molding resin, and it is preferable to employ the same material as the molding resin.

The lead frame 102 for use in the present invention is made of a metal (alloy), for example, an Fe—Ni-based alloy.

The pellet 101 is made of, for example, a silicon single-crystal substrate. This pellet is formed with a large number of circuit elements therein and is endowed with one circuit function by well-known techniques. Concrete examples of the circuit elements are MOS transistors, and a logical circuit and memory circuit function, for example, is formed by these circuit elements The bonding wire 108 is, for example, Au wire, Al wire or Cu wire.

According to the example shown in FIG. 1A, each of the plurality of leads 102a is buried in the resin layer 109 in enclosed fashion, so that any boundary connecting the adjacent leads 102a is not existent. Accordingly, the phenomenon of the peeling-off of the boundary cannot arise in principle. Therefore, the defect of the semiconductor device attributed to the flow of the leakage current between the leads 102a is avoided.

Moreover, since the electrical leakage is not apprehended, the choice of the material of the resin layer 109 becomes more versatile. As a result, by way of example, resin cracks which otherwise appear at the part of the resin mold member 104 corresponding to the lower end of the pellet 101 can be prevented by employing a resin material of low modulus of elasticity (E), and resin cracks which appear during a reflow soldering operation can be prevented by selecting a resin of low coefficient of moisture absorption.

On the other hand, in the example shown in FIG. 1B, the boundary is defined between the resin layer 109 and the resin mold member 104. Even in this case, however, the adhesive property of the boundary can be held favorable by employing, for example, an identical epoxy type material as the materials for forming the resin layer 109 and the resin mold member 104, with the result that the electrical leakage between the leads 102a can be prevented.

According to the present invention thus far described, the moisture-resistance reliability, a durability against temperature cycles, an immunity against reflow soldering, etc. are enhanced to heighten the reliability of the whole product. Moreover, in mounting a large-sized pellet, the inner leads of the leads 102a are in the very long shapes, so that the strength of the leads against pulling-out is high. As further advantages, since the pellet 101 and the leads 102a are electrically connected by the wire bonding between the bonding pads 107 and the fore ends 102b extended to the vicinities of the pellet sides near the pads, the pieces of bonding wire 108 can be shortened to prevent the occurrence of the short-circuiting between the wire pieces, and the amount of consumption of the wire 108 can be curtailed to lower the cost of the product.

In the above, the invention has been concretely described in conjunction with an embodiment. Needless to say, however, the present invention is not restricted to this embodiment, but it can be variously modified within a scope not departing from the purport thereof.

For example, although the foregoing embodiment has exemplified the pellet placing resin layer 109 formed of the resin plate, a resin mold piece in any other aspect may well be employed as long as it achieves both the function of the insulation between the pellet and the leads and the function of a pellet fixing body.

An effect which is attained by a typical aspect of performance of the present embodiment is briefly explained as follows:

According to the present embodiment, it is possible to provide a resin-encapsulated semiconductor device which is advantageous for mounting a large-sized pellet, and in particular, the moisture-resistance reliability of which can be enhanced more.

(2) Embodiment 2:

Now, an example of the second embodiment of the present invention will be described with reference to the drawings.

Figure 2A:
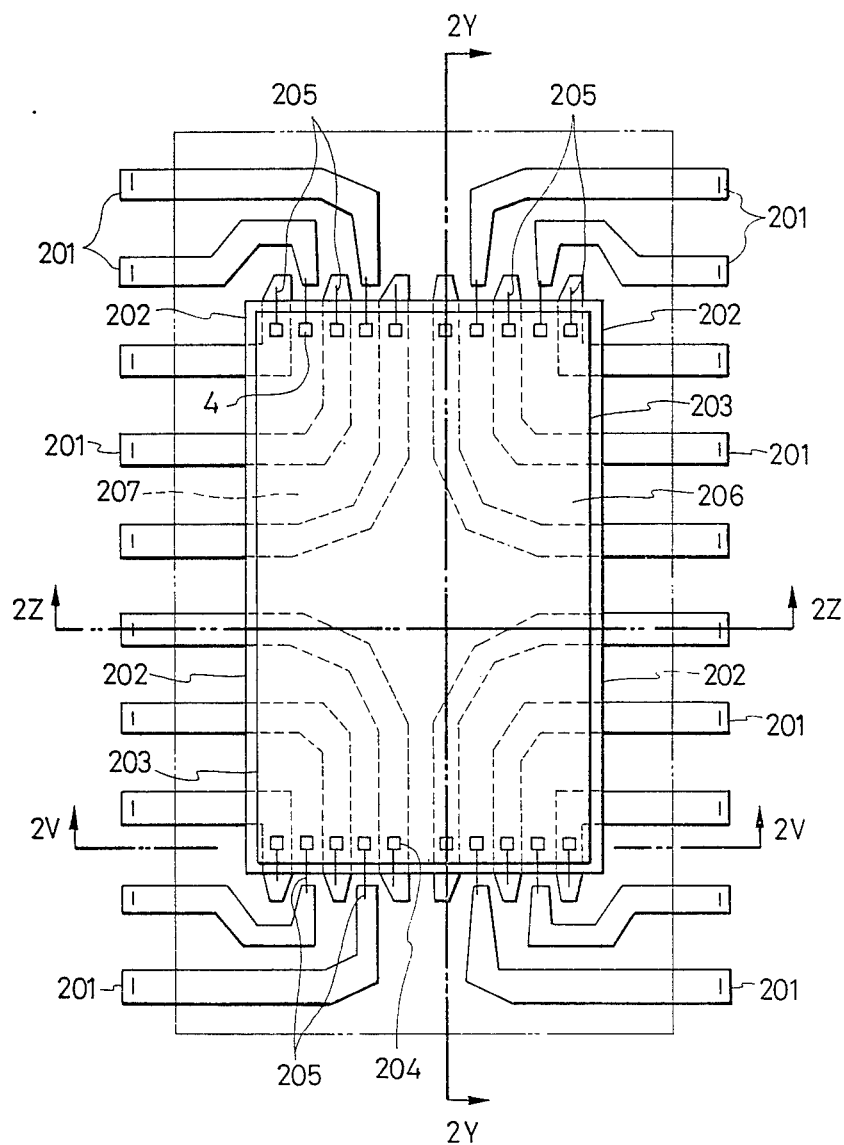
FIG. 2A is a plan view of leads on which a chip is mounted.
Figure 2B:
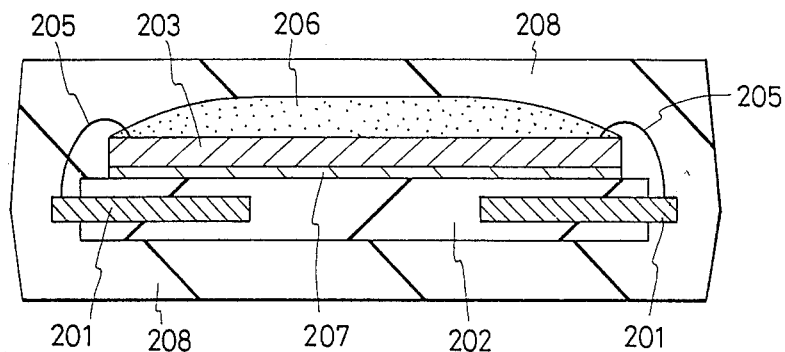
FIG. 2B is a sectional view taken along line 2Y—2Y in FIG. 2A.

FIG. 2A is a plan view of leads on which a chip is mounted;

FIG. 2B is a sectional view taken along line 2Y—2Y in FIG. 2A; and

Figure 2C:
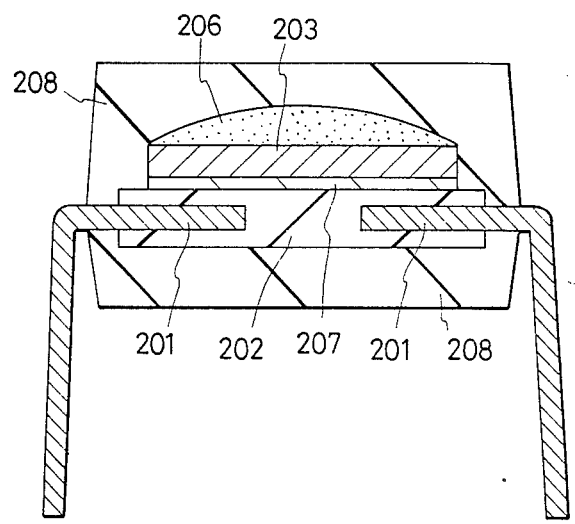
FIG. 2C is a sectional view taken along line 2Z—2Z in FIG. 2A.

FIG. 2C is a sectional view taken along line 2Z—2Z in FIG. 2A.

In FIG. 2A, a package (of resin) is not shown in order to facilitate understanding the construction of the leads, the chip, pieces of bonding wire, etc.

Referring to FIGS. 2A thru 2C, numerals 201 designate leads which are made of "42 alloy" by way of example, and the parts (outer leads) of which protrude from a package 208 are plate with a solder. Some of the leads 201 (twelve leads in FIG. 2A) are so shaped that each of them comes in under a chip (single-crystal silicon) 203 from one side surface thereof and goes out from under another side surface intersecting the first-mentioned side surface orthogonally, whereby these leads support the chip 203. The other leads 201 (eight leads in FIG. 2A) do not enter under the chip 203.

Those parts of the leads 201 supporting the chip 203 which underlie this chip 203 are buried in a polyimide layer (insulating film) 202 under the state under which they are isolated from the individual leads 201. The leads 201 which do not underlie the chip 203 (the eight leads in FIG. 2A) are not buried in the polyimide layer 202. As illustrated in FIG. 2A, the polyimide layer 202 is made larger than the chip 203, and the fore end parts of the buried leads 201 to which pieces of bonding wire 205 are connected are exposed from the polyimide layer 202. In this manner, each of the leads 201 entering under the chip 201 is buried in the polyimide layer 202, whereby it is fastened to the polyimide layer 202 without using any binder. The insulation resistance of the polyimide layer 202 is very high, and is on the order of $1 \times 10^{13} \Omega$. It is accordingly possible to prevent leakage currents from flowing between the leads 201 which support the chip 201.

The chip 203 is bonded on the polyimide layer 202 by a thermoplastic resin 207 or an Ag paste 207. The fore end parts of all the leads 201 in the package 208 are guided near the edges of the chip 203, and the pieces of bonding wire 205 are connected to the respective fore end parts. In both the leads 201 which are partially buried in the polyimide layer 202 and the leads 201 which are not buried in the polyimide layer 202 at all, the fore end parts to which the pieces of bonding wire 205 are connected are plated with Ag. The parts of the pieces of bonding wire 205 remote from the fore ends of the leads 201 are connected to the bonding pads 204 (not shown in FIG. 2B) of the chip 203. The upper surface of the chip 203 is sealed by, for example, silicone gel 206. The package 208 is made of a resin.

Figure 2D:
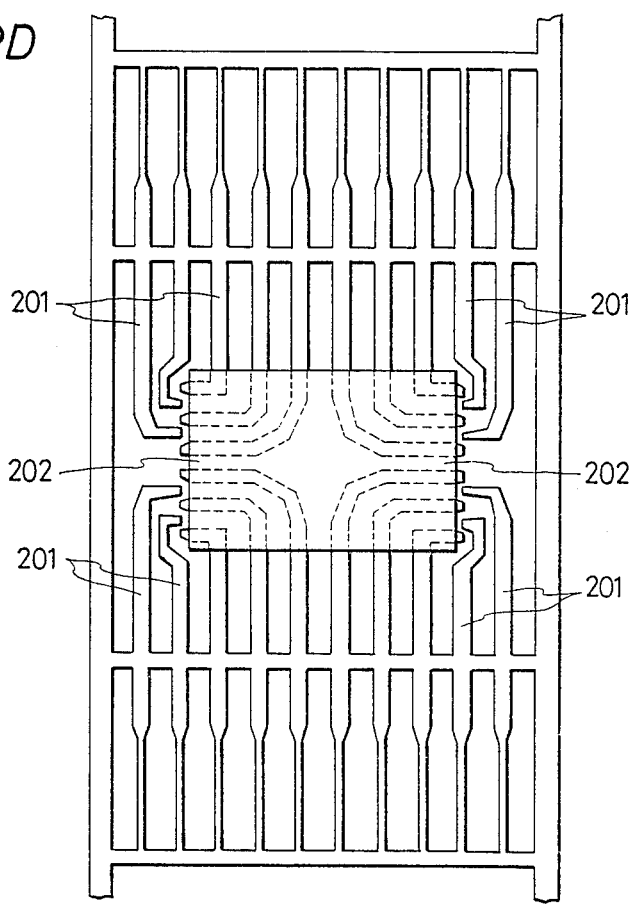
FIG. 2D is a plan view of a lead frame.

As illustrated in FIG. 2D which is a plan view of a lead frame, the polyimide layer 202 is formed so as to bury or envelop the predetermined parts of the leads 201 therein and is heated at about 360°–430° C. so as to be hardened before the chip 203 is mounted on this polyimide layer.

Alternatively, as regards a method of bonding the chip 203 to the polyimide layer 202, the chip 203 is depressedly bonded to the upper surface of the polyimide layer 202 after having buried the leads 201 therein and before being hardened, and the polyimide layer 202 is thereafter heated at 360°–430° C. so as to be hardened.

As described above, according to the first example of Embodiment 2, the leads 201 are individually buried in the polyimide layer 202 and are fastened to the polyimide layer 202 without using any binder, whereby the leads 201 are insulated by the polyimide layer 202 of high insulation resistance, so that the leakage currents can be prevented from flowing between the leads 201.

Next, another example of the present embodiment will be described.

Figure 2E:
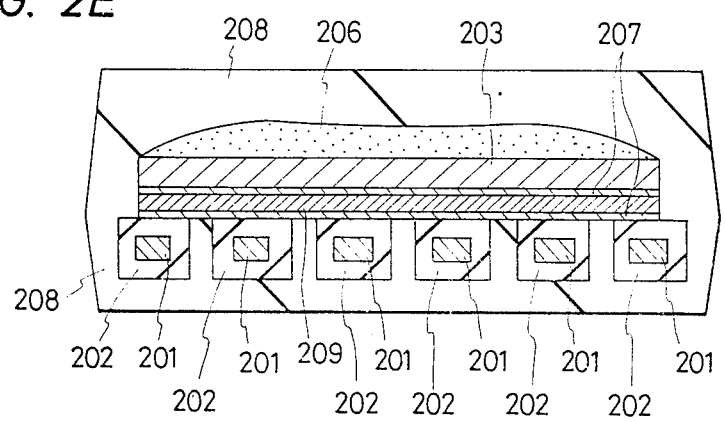
FIG. 2E is a sectional view of a semiconductor device showing the second embodiment of the present invention.

FIG. 2E is a sectional view of a semiconductor device in the second example of Embodiment 2 of the present invention. This figure shows the section of the semiconductor device of the second example as obtained when the part thereof corresponding to line 2V—2V in FIG. 2A is viewed, and bonding pads 204 and pieces of bonding wire 205 are omitted from the illustration.

In the semiconductor device of the second example, divided polyimide layers 202 are provided for individual leads 201 which enter under a chip 203. The polyimide layers 202 completely envelop at least the parts of the corresponding leads 201 underlying the chip 203. However, the polyimide layers 202 are isolated therebetween for the individual leads 201. A radiator plate 209 made of, for example, Cu is interposed between the chip 203 and the polyimide layers 202. In this example, an Ag paste 207 is used for bonding the polyimide layers 202 and the radiator plate 209, and the radiator plate 209 is bonded to the rear surface of the chip 203 with the Ag paste 207.

According to the semiconductor device of the second example described above, in addition to the effect of the first example, the heat radiation effect of the semiconductor device can be enhanced because heat generated by the chip 203 can be radiated by the radiator plate 209.

In the above, the present invention has been concretely described in conjunction with examples Needless to say, however, the present invention is not restricted to the examples, but it can be variously modified within a scope not departing from the purport thereof An effect which is attained by a typical aspect of performance of the present embodiment is briefly explained as follows:

In a semiconductor device wherein a chip is supported by some of leads, the parts of the leads to underlie the chip are buried in an insulating film, and the chip is bonded on the insulating film, whereby any binder of low insulation resistance is not existent on the front surfaces of the leads, and the parts of the leads under the chip are buried in the insulating film of high insulation resistance under the state under which they are isolated for the individual leads, so that leakage currents are prevented from flowing between the leads.

(3) Embodiment 3:

Now, the third embodiment of the present invention will be concretely described with reference to the drawings.

Throughout the drawings for describing the embodiment, parts having the same functions are assigned identical symbols, and they shall not be repeatedly explained.

Figure 3A:
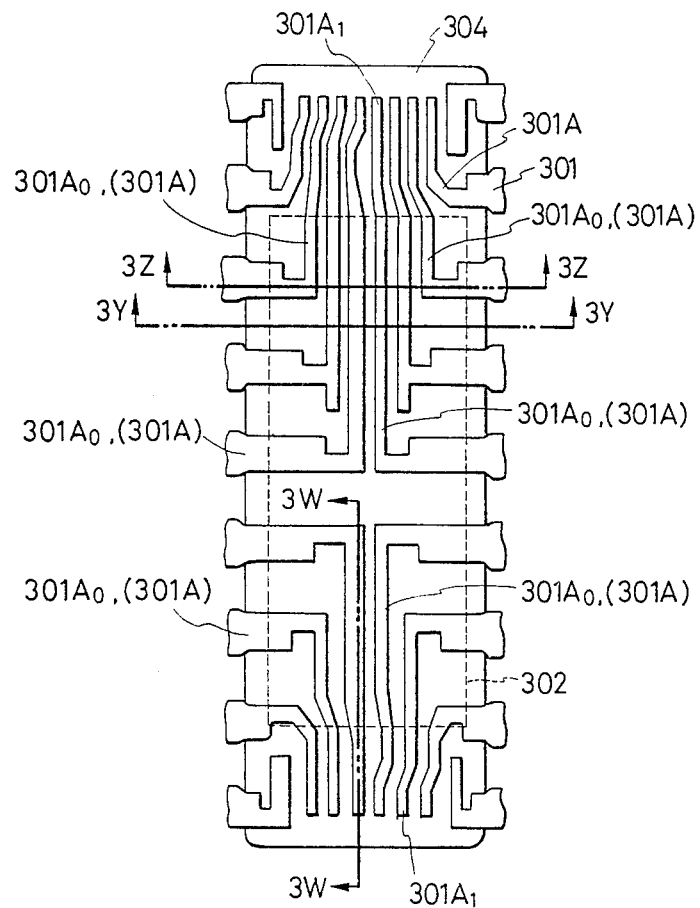
FIG. 3A is a plan view showing the state in which a lead frame in an example of the third embodiment of the present invention is installed.
Figure 3B:
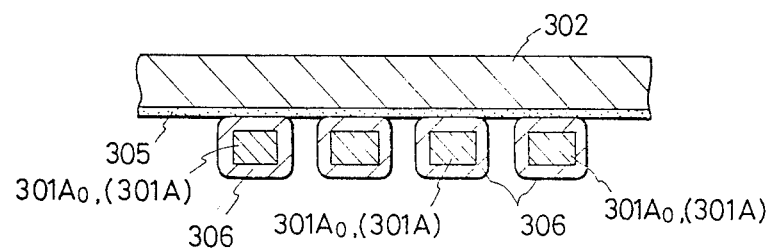
FIG. 3B is a sectional view taken along line 3Y—3Y indicated in FIG. 3A.
Figure 3C:
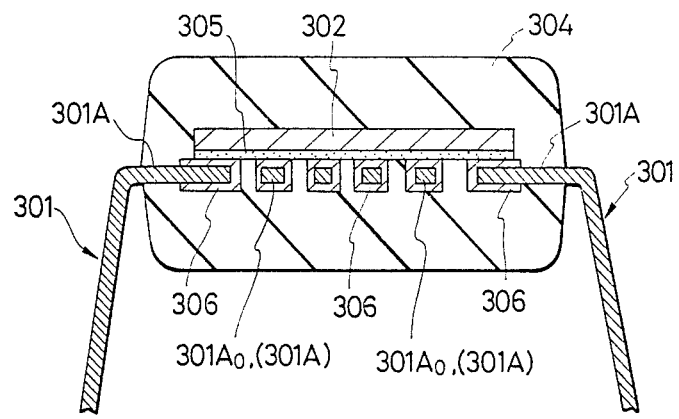
FIG. 3C is a sectional view of a semiconductor device employing the lead frame in FIG. 3A, taken along line 3Z—3Z indicated in FIG. 3A.
Figure 3D:
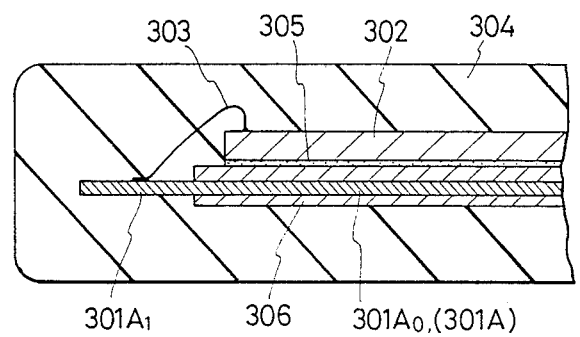
FIG. 3D is a sectional view of the semiconductor device employing the lead frame in FIG. 3A, taken along line 3W—3W indicated in FIG. 3A.

FIG. 3A is a plan view showing the state in which a lead frame in an example of the third embodiment of the present invention is installed;

FIG. 3B is a partial sectional view taken along line 3Y—3Y indicated in FIG. 3A;

FIG. 3C is a sectional view of a semiconductor device employing the lead frame in FIG. 3A, taken along line 3Z—3Z indicated in FIG. 3A; and FIG. 3D is a sectional view of the semiconductor device employing the lead frame in FIG. 3A, taken along line 3W—3W indicated in FIG. 3A.

As shown in FIGS. 3A, 3C and 3D, a semiconductor device employing a lead frame in the first example of this embodiment is such that a semiconductor chip 302 is mounted through a binder 305 on the semiconductor chip placing parts $301A_0$ of the inner leads 301A of a tabless lead frame 301, that the inner leads 301A and the semiconductor chip 302 are electrically connected by pieces of bonding wire 303, and that the resultant structure is encapsulated with a resin mold member 304.

The lead frame 301 is made of, for example, "42 nickel-iron alloy" (42 Ni—Fe alloy). As shown in FIGS. 3A and 3B, it is so shaped that the plurality of inner leads 301A are extended under the semiconductor chip 302 and that bonding terminals $301A_1$ are arranged on the shorter sides of the package. As shown in FIG. 3B, the semiconductor chip placing parts $301A_0$ of the inner leads 301A are subjected to an insulating treatment with an insulating substance, for example, thermosetting polyimide type resin 306. The insulating treatment is carried out by partially coating the semiconductor chip placing parts $301A_0$ of the inner leads 301A with the insulating substance such as thermosetting polyimide type resin 306 in a liquid state and then heat-treating the liquid substance. Alternatively, it is carried out by covering the semiconductor chip placing parts $301A_0$ of the inner leads 301A with the insulating substance such as thermosetting polyimide type resin 306 in the shape of a tape and then heat-treating the tape-shaped substance.

Using the binder 305, the semiconductor chip 302 is directly mounted on the semiconductor chip placing parts $301A_0$ of the inner leads 301A subjected to the insulating treatment.

Figure 3E:
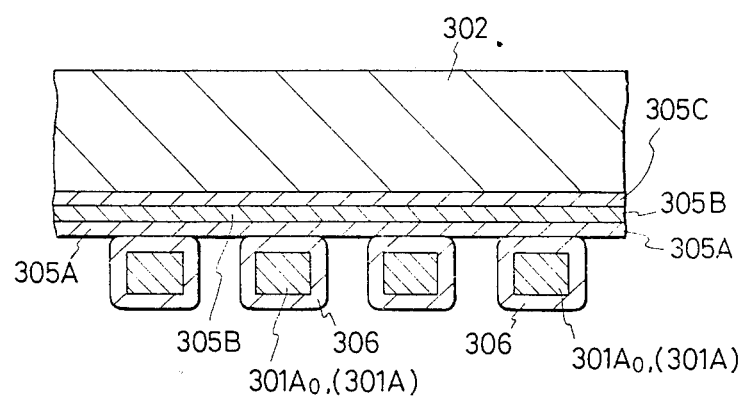
FIG. 3E is a view for explaining the third embodiment as to the insulating treatment of the semiconductor chip placing parts of inner leads shown in FIG. 3B.

As illustrated in an explanatory view of FIG. 3E, the binder 305 is made of, for example, a multilayer binder in which a thermoplastic binder 305A of polyether amidoimide or the like, a thermosetting polyimide type resin binder 305B of polypyromellitic imide, polyketone imide or the like, and a thermosetting binder 305C for fixing the pellet are stacked in the mentioned order from the inner lead side The thermosetting binder 305C for fixing the pellet is, for example, silicone rubber, epoxy rubber, an epoxy type resin, or a polyimide type resin.

Next, an example of the insulating treatment of the semiconductor chip placing parts $301A_0$ of the inner leads 301A will be briefly described.

Figure 3F:
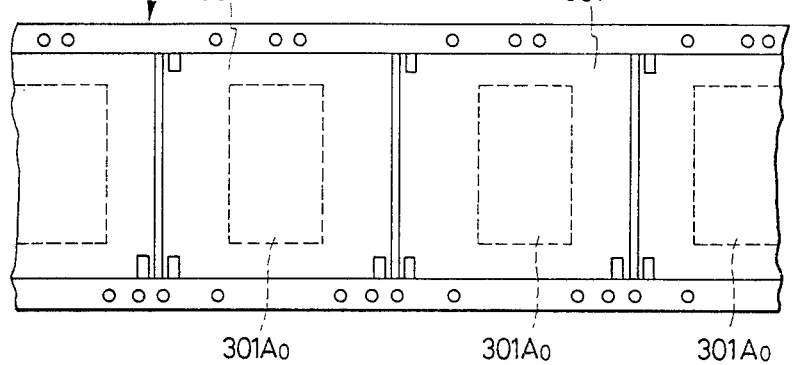
FIG. 3F is a view for explaining the schematic construction of a lead frame blank in which a plurality of lead frames as shown in FIG. 3A are aligned.
Figure 3F:
Figure 3F:
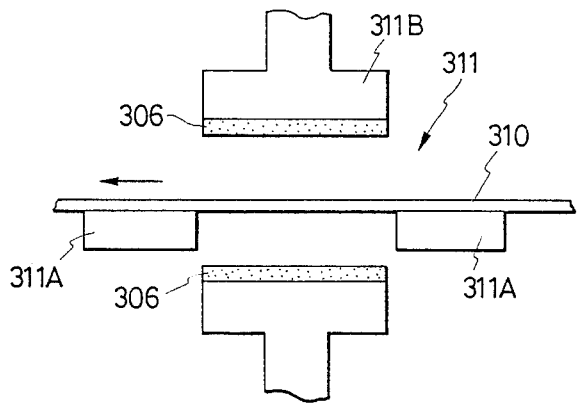
Figure 3F:
Figure 3F:
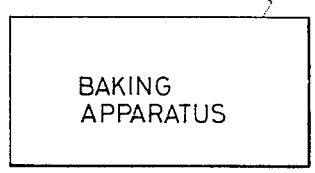

As illustrated in an explanatory flow chart of FIG. 3F, a lead frame blank 310 in which a plurality of lead frames 301 are aligned is put on the pedestals 311A of a transfer apparatus 311, the transfer heads 311B of the transfer apparatus 311 are coated with an insulating substance such as thermosetting polyimide type resin 306 in a liquid state, and the insulating substance 306 is transferred to the semiconductor chip placing parts $301A_0$ of the inner leads 301A.

Subsequently, using a baking apparatus 312, the insulating substance 306 has its solvent vaporized away by a baking process and is thereafter hardened by a heat treatment.

Next, a method of assembling the semiconductor device of the present embodiment will be briefly described.

Figure 3G:
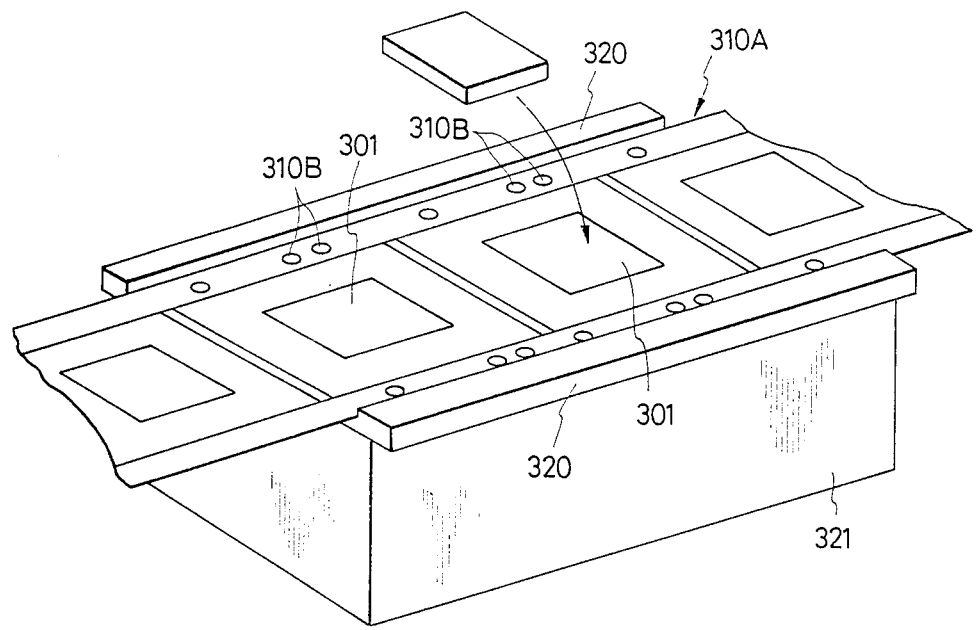
FIG. 3G is a view for explaining an expedient for assembling the semiconductor device by the use of the lead frame in the example of the third embodiment.

A lead frame member 310A which is the foregoing lead frame blank 310 provided with the insulating substance 306 is guided along lead frame guide rails 320 shown in an explanatory perspective view of FIG. 3G, and it is automatically arranged on the predetermined position of a heat block 321 by utilizing the positioning holes 310B of the foregoing lead frames 301.

Subsequently, as shown in FIG. 3C, the semiconductor chip 302 is directly mounted on the semiconductor chip placing parts $301A_0$ of the inner leads 301A with the binder 305. On this occasion, the semiconductor chip 302 is automatically positioned by a gate (not shown) formed in this semiconductor chip 302 and a semiconductor chip gate positioning hole (not shown) formed in the lead frame member 310A. In addition, the pellet fixation of the semiconductor chip 302 is carried out at a predetermined temperature for a predetermined time, for example, at a temperature of 200° C. for 30 minutes—1 hour or so.

Subsequently, as shown in FIG. 3D, the semiconductor chip 302 and the bonding terminals $301A_1$, which are arranged on the shorter sides of the package with the inner leads 301A extended under the semiconductor chip 302, are electrically connected by the pieces of bonding wire 303. Gold (Au) wire, for example, is employed as the bonding wire 303. By way of example, the wire bonding is carried out by ultrasonic thermocompression at a temperature of 200° C. at a nailhead as illustrated in an explanatory sectional view of FIG. 3H. The parts of the bonding terminals 301A$_1$ of the inner leads 301A to be bonded are plated with silver (Ag), and the parts of the outer leads of the lead frame 301 are plated with solder.

Figure 3H:
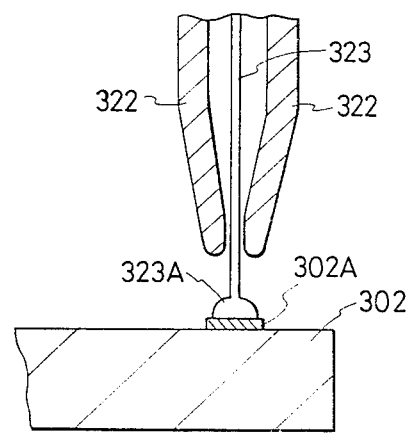
FIG. 3H is a view for explaining means for wire bonding shown in FIG. 3G.

Referring to FIG. 3H, symbol 322 denotes a capillary, symbol 323 a bonding wire member, symbol 323A a gold (Au) ball, and symbol 302A a pad (electrode) made of aluminum (Al) and disposed on the semiconductor chip 302.

Besides, when the semiconductor chip 302 and the inner lead 301A are to be electrically connected by the bonding wire 303, the bonding position (two points) of each pad 302A on the side of the semiconductor chip 302 is recognized to determine the coordinates thereof, and the wire bonding is automatically performed.

When the wiring bonding has ended, the resultant structure is encapsulated with the resin mold member 304 made of an epoxy type resin or the like.

As understood from the above description, according to the first example of Embodiment 3, the semiconductor chip placing parts 301A$_0$ of the individual inner leads 301A are subjected to the insulating treatment, whereby leakage (short-circuiting) currents do not flow between the individual inner leads through the boundary of an insulating film for placing the semiconductor chip thereon (this insulating film is not used in the first example) and the resin mold member 304, so that the leakage (short-circuiting) between the individual inner leads 301A can be prevented.

Figure 3I:
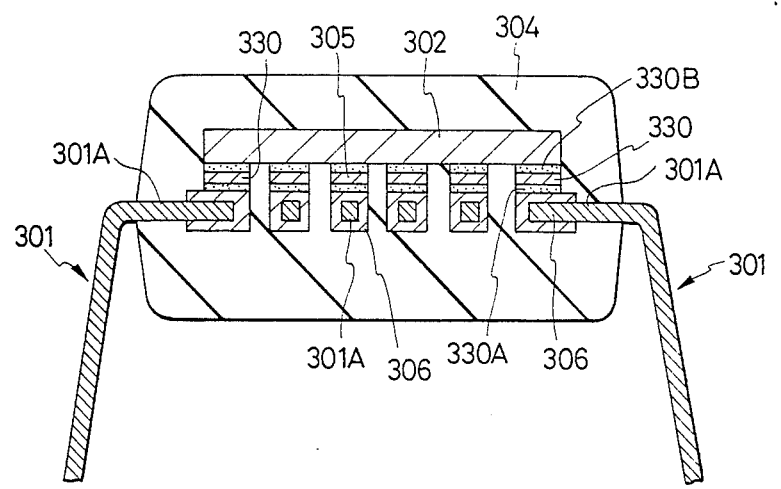
FIGS. 3I and 3J are sectional views showing the schematic construction of a semiconductor device which employs a lead frame in another example of the third embodiment of the present invention.
Figure 3J:
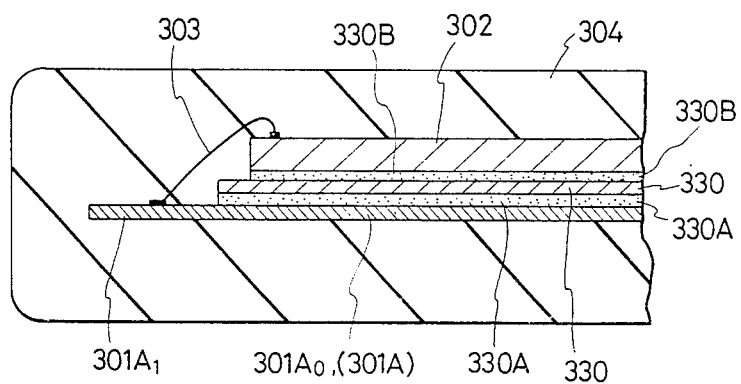

FIGS. 3I and 3J are sectional views showing the schematic construction of a semiconductor device which employs a lead frame in another example of Embodiment 3 of the present invention.

As shown in these figures, the semiconductor device employing the lead frame in the second example of this embodiment is such that an insulating film 330 is provided on only the upper surfaces of the semiconductor chip placing parts 301A$_0$ of the inner leads 301A of the lead frame 301 in the first example stated before. The insulating film 330 is fixed on the semiconductor chip placing parts 301A$_0$ of the inner leads 301A of the lead frame 301 by a binder 330A, and the semiconductor chip 302 is mounted on the insulating film 330 by a binder 330B. As the insulating film 330, a film of polyimide type resin (Capton) is employed by way of example. The binder 330B for the insulating film 330 and the semiconductor chip 302 is a binder of silicone rubber, epoxy rubber, an epoxy type resin, a polyimide type resin or the like, while the binder 330A for the inner leads 301A and the insulating film 330 is a thermoplastic binder of polyether amidoimide or the like.

A process for forming the insulating film 330 on only the upper surfaces of the semiconductor chip placing parts 301A$_0$ of the inner leads 301A of the lead frame in this manner, may be, for example, the transfer technique illustrated in FIG. 3F.

With the inner leads 301A of such a structure, the same effect as in the first example can be attained.

In the above, the present invention has been concretely described in conjunction with examples. Needless to say, however, the present invention is not restricted to the examples, but it can be variously modified within a scope not departing from the purport thereof.

Figure 4A:
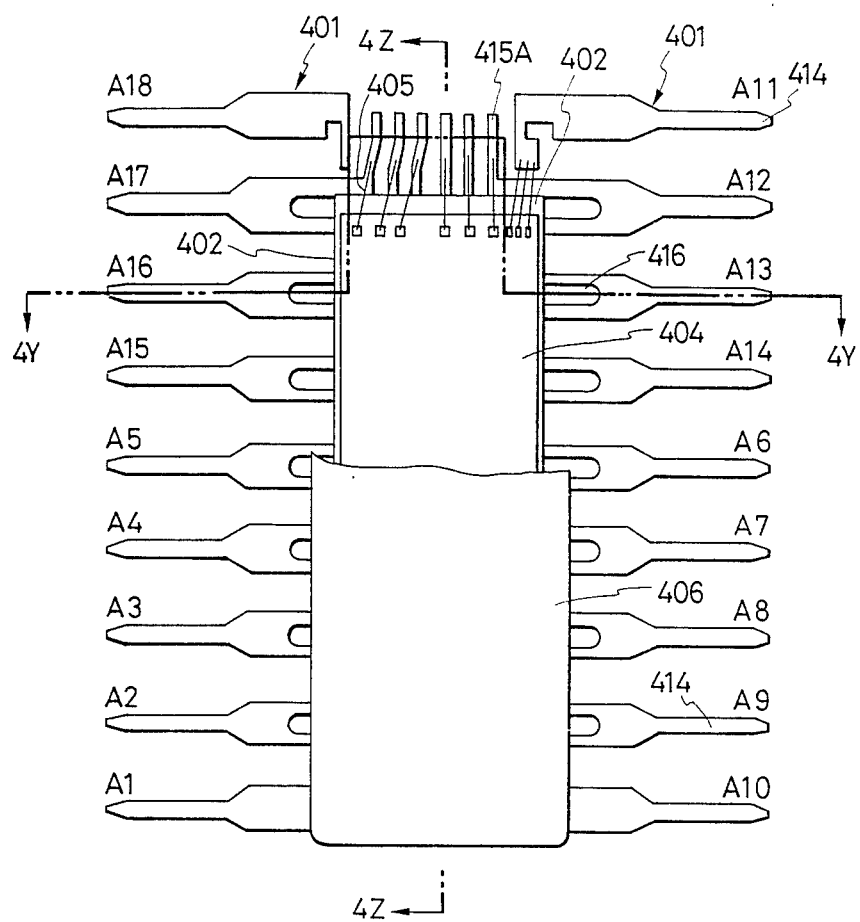
FIG. 4A is a plan view, partly broken away, for explaining the structure of a resin-encapsulated semiconductor device inside the package thereof, in an embodiment in which the present invention is applied to a 4-magabit DRAM having the dual in-line type package.
Figure 4B:
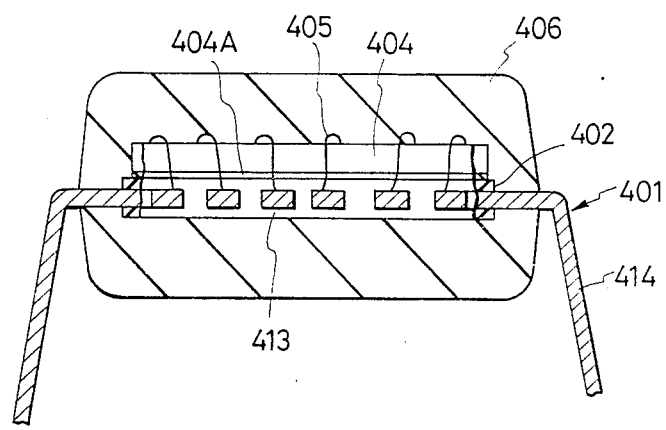
FIG. 4B is a sectional view taken along the line 4Y—4Y of the 4-megabit DRAM shown in FIG. 4A.
Figure 4C:
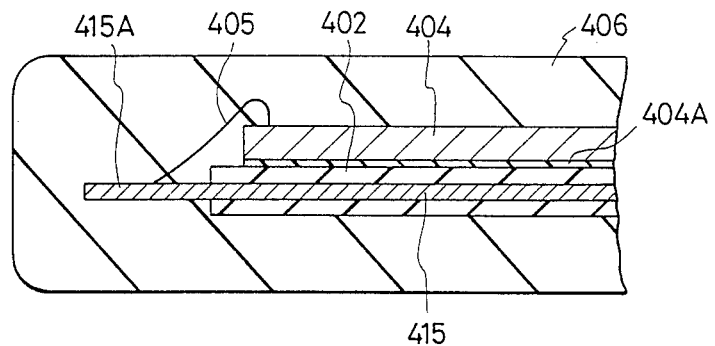
FIG. 4C is a sectional view taken along the line 4Z—4Z of the 4-megabit DRAM shown in FIG. 4A.
Figure 4D:
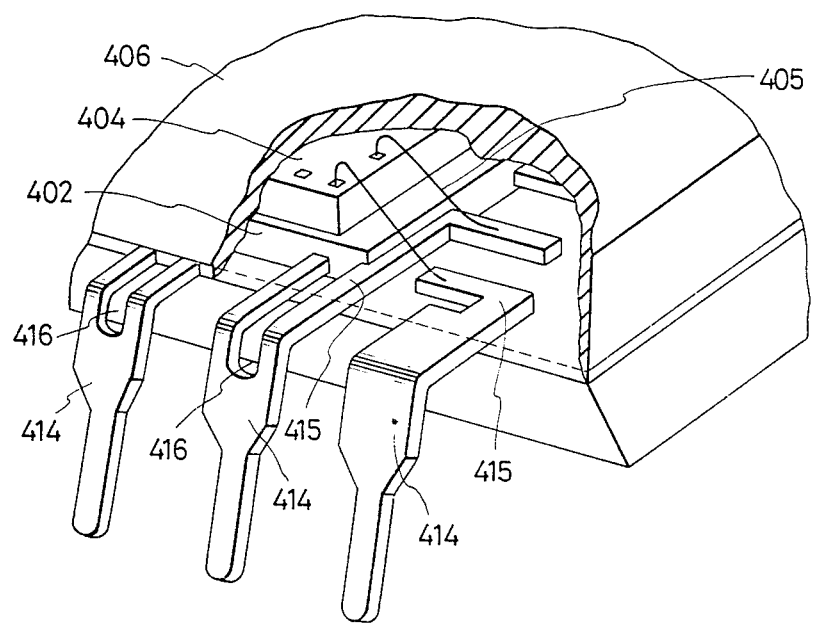
FIG. 4D is a perspective view, partly broken away, for explaining the essential portions of the 4-megabit DRAM shown in FIG. 4A.
Figure 4E:
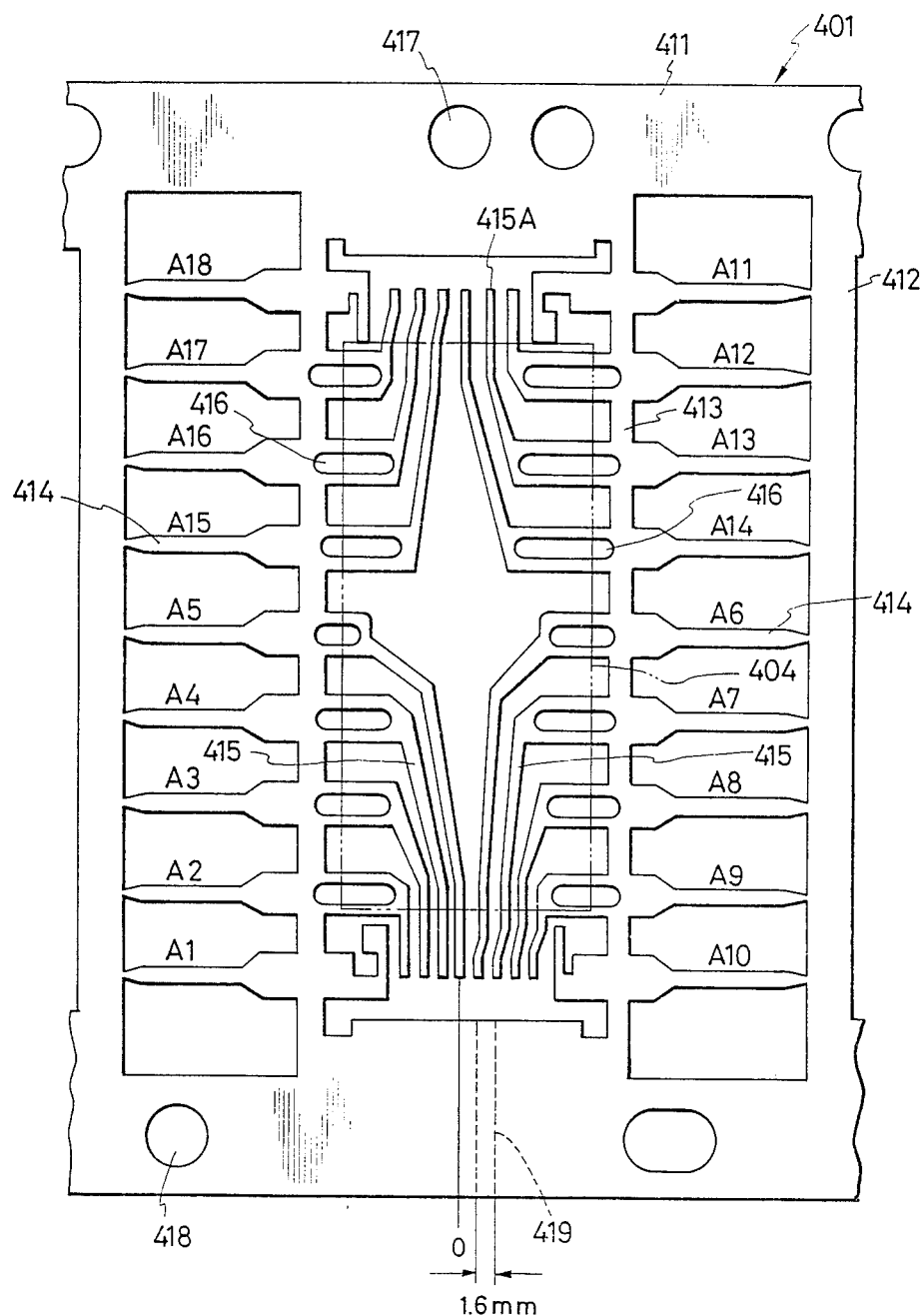
FIG. 4E is a plan view of a tabless lead frame shown in FIG. 4A.

(4) Embodiment 4:

FIG. 4A is a plan view, partly broken away, for explaining the structure of a resin-encapsulated semiconductor device inside the package thereof, in an embodiment in which the present invention is applied to a 4-megabit dynamic random access memory (4M-DRAM) having the dual in-line type package;

FIG. 4B is a sectional view taken along the line 4Y—4Y of the 4M-DRAM shown in FIG. 4A;

FIG. 4C is a sectional view taken along the line 4Z—4Z of the 4M-DRAM shown in FIG. 4A;

FIG. 4D is a perspective view, partly broken away, for explaining the essential portions of the 4M-DRAM shown in FIG. 4A; and FIG. 4E is a plan view of a tabless lead frame shown in FIG. 4A.

As shown in FIGS. 4A thru 4D, the resin-encapsulated semiconductor device of this embodiment in which the semiconductor chip of a 4M-DRAM is mounted is such that an insulating film 402 is bonded on the inner lead portions 415 of a tabless lead frame 401 with a binder 403, that the semiconductor chip 404 of the 4M-DRAM is mounted on the insulating film 402, that the inner lead portions 415 and the semiconductor chip 404 are electrically connected by pieces of bonding wire 405, and that the resultant structure is encapsulated with a resin mold member 406.

As shown in FIG. 4E, the tabless lead frame 401 is made of a single plate of copper alloy or iron-nickel alloy (for example, 50% Ni—Fe) which is thin (for example, at a thickness of 0.25 mm). In addition, the tabless lead frame 401 includes two outer frames 411 which are parallel to each other, an inner frame 412 which extends orthogonally to the outer frames 411 on both the sides of the tabless lead frame and which connects them, outer lead portions 414 which extend toward the middle of a space formed by the outer frames 411 and the inner frame 412 and which are continuous to tie bars 413, and the inner lead portions 415 which extend toward the middle of a space formed by the outer frames 411 and the tie bars 413 and which pass under the semiconductor chip 404 indicated by a chain line.

As shown in FIG. 4D, an oblong through hole 416 is provided in or near that part of each inner lead portion 415 to which the semiconductor chip 404 is fixed. That is, the oblong through hole 416 is formed so as to run from the inner lead portion 415 passing under the semiconductor chip 404 to the outer lead portion 414. The through holes 416 serve to prevent the resin mold member 406 from cracking in temperature cycles during the operation of the semiconductor device (4M-DRAM). More specifically, the resin mold member 406 might crack due to stresses which are attributed to the difference between the coefficient of thermal expansion of the inner lead portions 415 (the coefficient of "42 Ni—Fe" is $\alpha=0.4\times10^{-5}$/°C., and that of Cu is $\alpha=1.7\times10^{-5}$/°C.) and the coefficient of thermal expansion of this resin mold member 406 (the coefficient of a resin is $\alpha=1.0\times10^{-5}$/°C.) in the temperature cycles. Therefore, the oblong through holes 416 are formed in and near the parts of the inner lead portions 415 to which the semiconductor chip 404 is fixed, to increase the proportion of the contact between the inner lead portions 415 and the resin mold member 406 more than in a prior-art lead frame, whereby the bonding strength between the resin mold member 406 and the inner lead portions 415 can be raised, so that the appearance of the cracks ascribable to the thermal stresses of the temperature cycles etc. can be reduced. Moreover, it is possible to relieve the apprehension that crevices will be developed between the resin mold member 406 and the inner lead portions 415 by the bending work of the outer lead portions 414.

As shown in FIG. 4E, the respective inner lead portions 415 are continuous to the tie bars 413, and bonding terminal portions 415A corresponding thereto are arrayed at predetermined intervals near the outer frames 411 on both the sides.

Registering holes 417 for assemblage and positioning holes 418 for molding (encapsulation) are provided in the predetermined positions of the outer frames 411 on both the sides, respectively.

In addition, the position of a gate 419 for injecting the material of the resin mold member 406 is set at a position somewhat deviating from the center line O of the tabless lead frame 401. The gate 419 is formed at a width of, for example, about 1.6 mm. Since the molding is relied on a conventional method, it shall not be explained here.

Figure 4F:
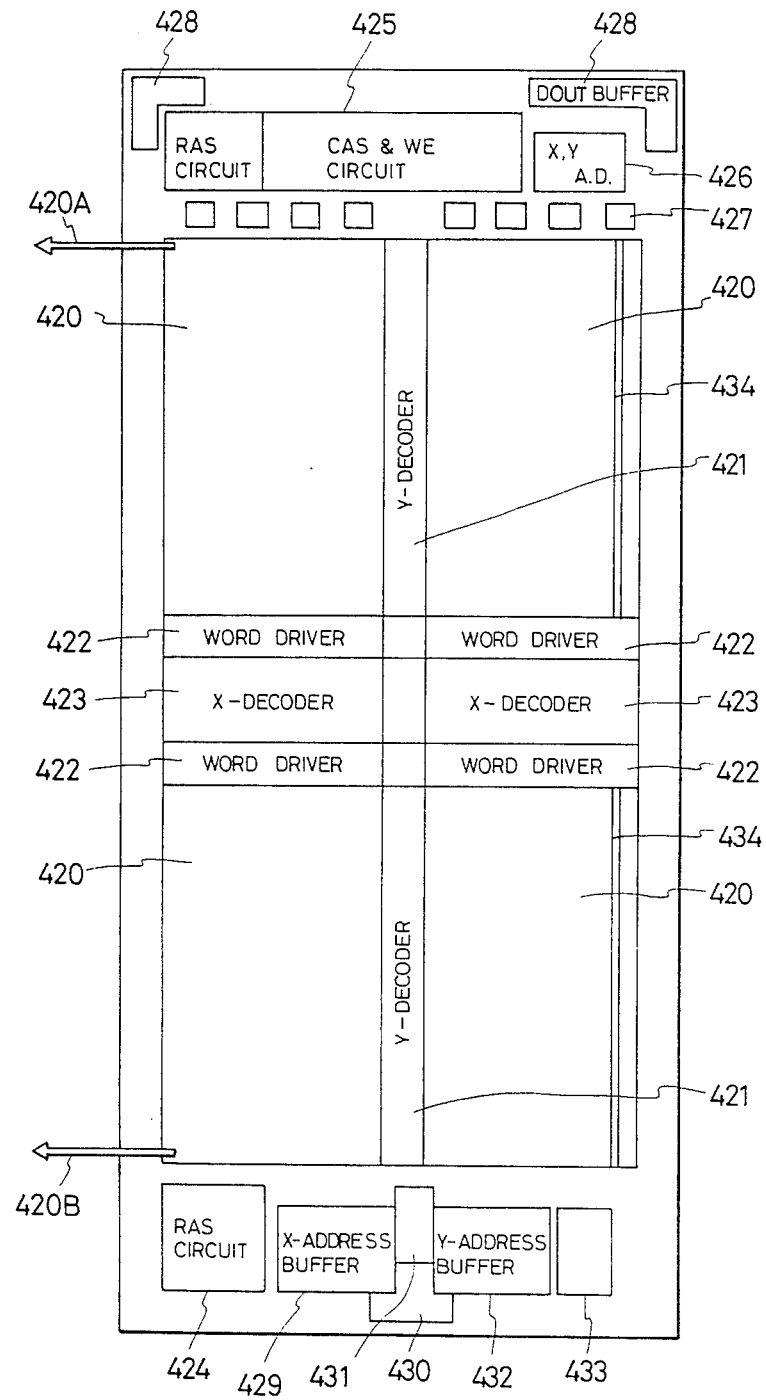
FIG. 4F is a plan view showing the circuit layout of a semiconductor chip shown in FIG. 4A.

The semiconductor chip 404 includes the 4M-DRAM. As shown in FIG. 4F which is a plan view showing the circuit layout of the semiconductor chip, memory mats 420 are disposed in the central part of the semiconductor chip, Y-decoders 421 are disposed in parallel with a Y-axis and along the memory mats 420 in the X-directional central part thereof, and word drivers 422 and X-decoders 423 are disposed in parallel with an X-axis and along the memory mats 420 in the Y-directional central part thereof.

In one end part of the semiconductor chip in the longitudinal direction thereof, a RAS circuit 424, a CAS/WE circuit 425, and an address buffer 426 for addresses X9, 10 and Y9, 10 are disposed, main amplifiers 427 are disposed on the inner side of the end part, and $D_{out}$ buffers 428 are disposed at the corners of the end part. In the other end part of the semiconductor chip, there are disposed a RAS circuit 424, an X-address buffer 429, an X-generator 430, a Y-generator 431, a Y-address buffer 432, and an SHR/PC generator 433. Besides, in the right end part of the semiconductor chip in the lateral direction thereof, the common inputs/outputs and common sources 434 of the sense amplifiers are disposed, while in the left end part, the upper terminals 420A and lower terminals 420B of the memory mats 420 are respectively disposed at the upper end and lower end of this left end part.

Figure 4G:
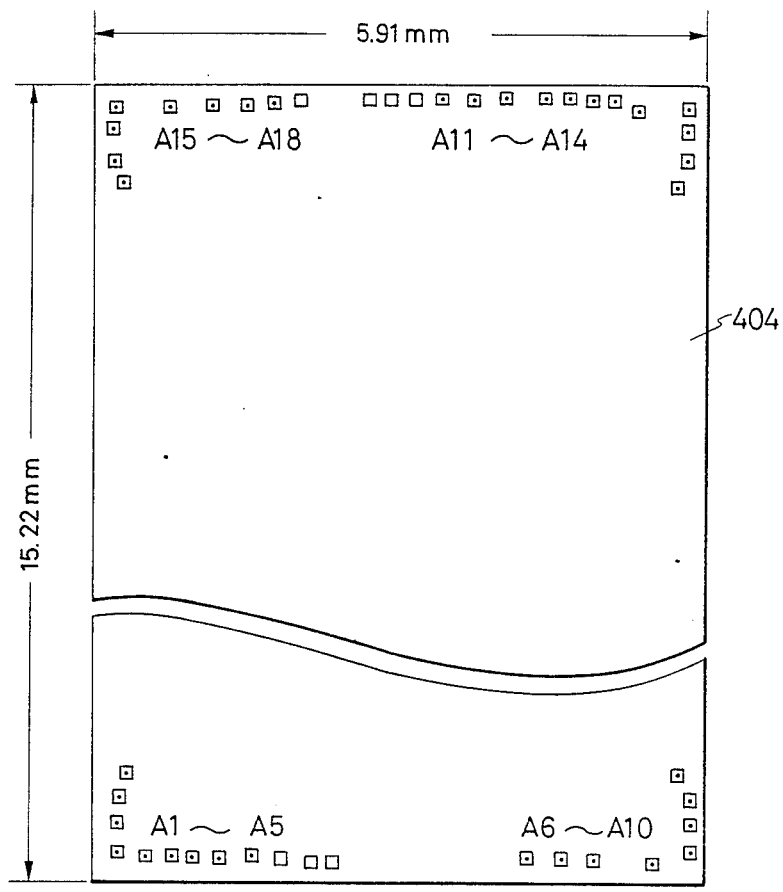
FIG. 4G is a plan view showing the arrangement of pads on the semiconductor chip shown in FIG. 4A.
Figure 4H:
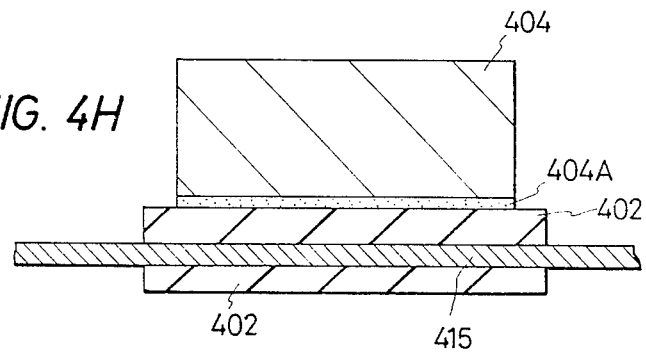
FIG. 4H is a sectional view for explaining a binder which serves to mount the semiconductor chip on the lead frame as illustrated in FIG. 4A.

As shown in FIG. 4G which is a plan view for explaining pads, the electrodes (pads) A1–A18 and P1–P3 of various elements included in the semiconductor chip 404 are disposed in both the end parts of the semiconductor chip 404 in the longitudinal direction thereof. The electrodes (pads) A1–A18 are bonding pads, while the electrodes (pads) P1–P3 are probing pads.

Next, a process for assembling the resin-encapsulated semiconductor device of the present embodiment will be described.

As illustrated in FIGS. 4A thru 4C, the inner lead portions 415 of the tabless lead frame 401 shown in FIG. 4E are put in a metal mold, and a resin is poured into the metal mold as in the preceding embodiment, whereby the insulating plate or layer 402 is formed. Any of the thermoplastic resins, etc. mentioned in the preceding examples is employed as the material of the insulating layer 402. The semiconductor chip 404 is fixed onto the insulating plate 402 by a thermosetting binder for pellet fixation 404A. By way of example, the pellet-fixing thermosetting binder 404A is a multilayer binder in which a nonconductive paste material, for example, silicone rubber, epoxy rubber, an epoxy type resin or a polyimide type resin is stacked on a thermosetting polyimide type resin binder of polypyromellitic imide, polyketone imide or the like.

Subsequently, the bonding terminal portions 415A of the inner lead portions 415 and the electrodes (pads) A1–A18 are electrically connected by the pieces of bonding wire 405. The bonding wire 405 is, for example, gold (Au) wire having a diameter of 30 μm. As regards the wire bonding, by way of example, the pads A1–A18 on the semiconductor chip 404 and the pieces of bonding wire 405 are connected by wedge ball bonding. Likewise, the bonding terminal portions 415A of the inner lead portions 415 and the pieces of bonding wire 405 are connected by thermocompression combined with ultrasonic vibrations. The parts of the bonding terminal portions 415A of the inner lead portions 415 to be bonded are plated with silver (Ag). Besides, when the semiconductor chip 404 and the inner lead portions 415 are to be electrically connected by the bonding wire 405, the bonding position (two points) of each of the pads A1–A18 on the side of the semiconductor chip 404 is recognized to determine the coordinate thereof, and the wire bonding is automatically performed.

When the wire bonding has ended, the position of the gate 419 of the tabless lead frame 401 is registered with the injection port of the cavity of an apparatus for pouring the material of the resin mold member 406, and the material (an epoxy type resin or the like) is poured into the cavity so as to mold the above-stated structure. Thereafter, the outer lead portions 414 are worked into predetermined shapes. Then, the resin-encapsulated semiconductor device is finished up.

Figure 5A:
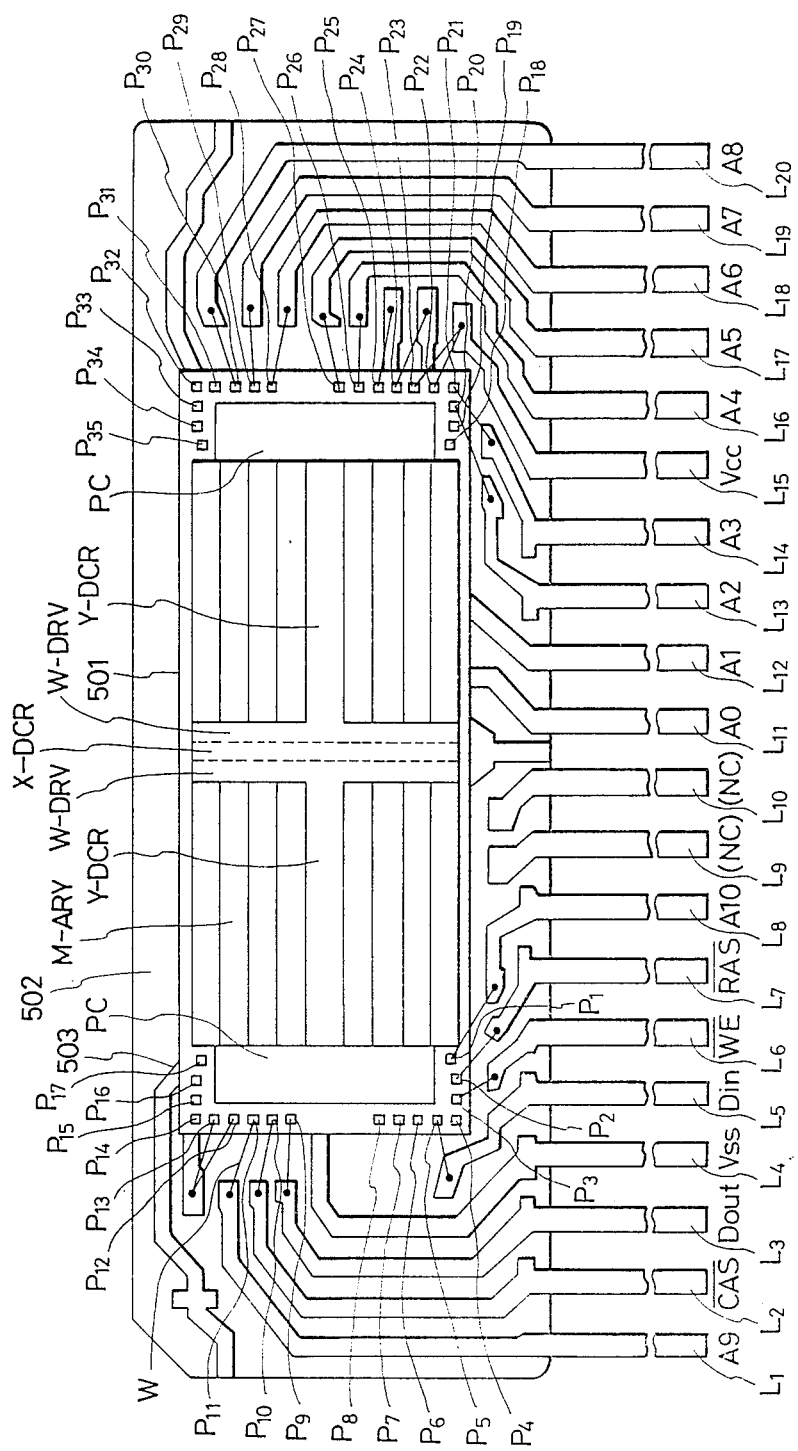
FIG. 5A is a side view showing the internal structure of a ZIP type package in the fifth embodiment of the present invention.

(5) Embodiment 5:

FIG. 5A is a side view showing the internal structure of a ZIP type package in this embodiment, FIG. 5B is a side view showing the shapes of leads in the ZIP type package shown in FIG. 5A, FIG. 5C is a side view showing the external appearance of the ZIP type package shown in FIG. 5A, FIG. 5D is a bottom view of the ZIP type package shown in FIG. 5C, and FIG. 5E is a sectional view taken along line 5X—5X in FIG. 5C.

As shown in FIGS. 5A–5E, in a ZIP type package according to the fifth embodiment of the present invention, a semiconductor chip, for example, silicon chip 501 which constructs a dynamic RAM of 4 Mbits (for example, 4M×1 bit format) by way of example is molded in a resin 502. Incidentally, the package size of this ZIP type package is 350 mils by way of example. Symbols $L_1$–$L_{20}$ denote leads, which number twenty in this case. That is, the ZIP type package according to this embodiment has twenty pins (as will be described later, however, the pins which are actually used are in a number of eighteen). These leads $L_1$–$L_{20}$ are formed using a tabless lead frame. Among them, the leads $L_4$, $L_{11}$ and $L_{12}$ are drawn passing under the semiconductor chip 501. That is, a region under the semiconductor chip 501 is also used for drawing the leads $L_4$, $L_{11}$ and $L_{12}$. Thus, reduction in the package size can be achieved to that extent. In addition, symbol 503 denotes a supporting plate for supporting the semiconductor chip 501. The semiconductor chip 501 is mostly supported by the supporting plate 503, but it is partially supported by the leads $L_4$, $L_{11}$ and $L_{12}$. That is, the semiconductor chip 501 is supported by the supporting plate 503 and the leads $L_4$, $L_{11}$ and $L_{12}$. In this case, the semiconductor chip 501 is placed on the supporting plate 503 and the leads $L_4$, $L_{11}$ and $L_{12}$ through a sheet 504 of, for example, polyimide resin (FIG. 5E), whereby the electrical insulation between the supporting plate 503 and the leads $L_4$, $L_{11}$ and $L_{12}$ and the electrical insulation between these leads $L_4$, $L_{11}$ and $L_{12}$ can be achieved.

As shown in FIG. 5A, the semiconductor chip 501 is provided with, for example, four memory cell arrays M-ARY, an X-decoder X-DCR, Y-decoders Y-DCR, word line drivers W-DRV, and peripheral circuits PC. By way of example, each of the memory cell arrays M-ARY is divided into four sections each being of 256 kbits. Besides, bonding pads $P_1$–$P_{35}$ are disposed on the end parts of the semiconductor chip 501 on the shorter sides thereof. Among them, the bonding pads $P_1$–$P_3$, $P_5$, $P_9$–$P_{13}$, and $P_{20}$–$P_{30}$ are bonded with the leads $L_1$–$L_8$, and $L_{11}$–$L_{20}$ by pieces of wire W. As understood from this fact, the semiconductor chip 501 is provided with the bonding pads $P_4$, $P_6$–$P_8$, $P_{14}$–$P_{19}$, and $P_{31}$–$P_{35}$ which are not actually used. These bonding pads are used in case of employing an SOJ type package or a DIP type package instead of the ZIP type package. Since, in this manner, the semiconductor chip 501 is provided with the bonding pads $P_1$–$P_{35}$ so as to be capable of coping with the different sort of package from the ZIP type package, the same semiconductor chip 501 can conform to the package other than the ZIP type package. That is, when it has become necessary to use the package other than the ZIP package, the necessity can be met merely by altering the package to be used, without designing the semiconductor chip 501 anew.

The functions of the leads (pins) $L_1$–$L_{20}$ are as indicated in FIG. 5A. Here, symbols A0–A10 denote address signals, symbol $V_{cc}$ a power source potential, symbol $V_{ss}$ a ground potential, symbol CAS a column address strobe signal, symbol RAS a row address strobe signal, symbol WE a write enable signal, symbol $D_{out}$ a data output, and symbol $D_{in}$ a data input. By the way, the leads $L_9$ and $L_{10}$ are not actually used and are denoted by NC. In addition, the lead $L_{15}$ of the potential $V_{cc}$ and the bonding pads $P_{22}$, $P_{23}$ are bonded by two pieces of wire W, while the lead $L_4$ and the bonding pads $P_{12}$, $P_{13}$ are bonded by two pieces of wire W. This is intended to lower a power source impedance.

Figure 6A:
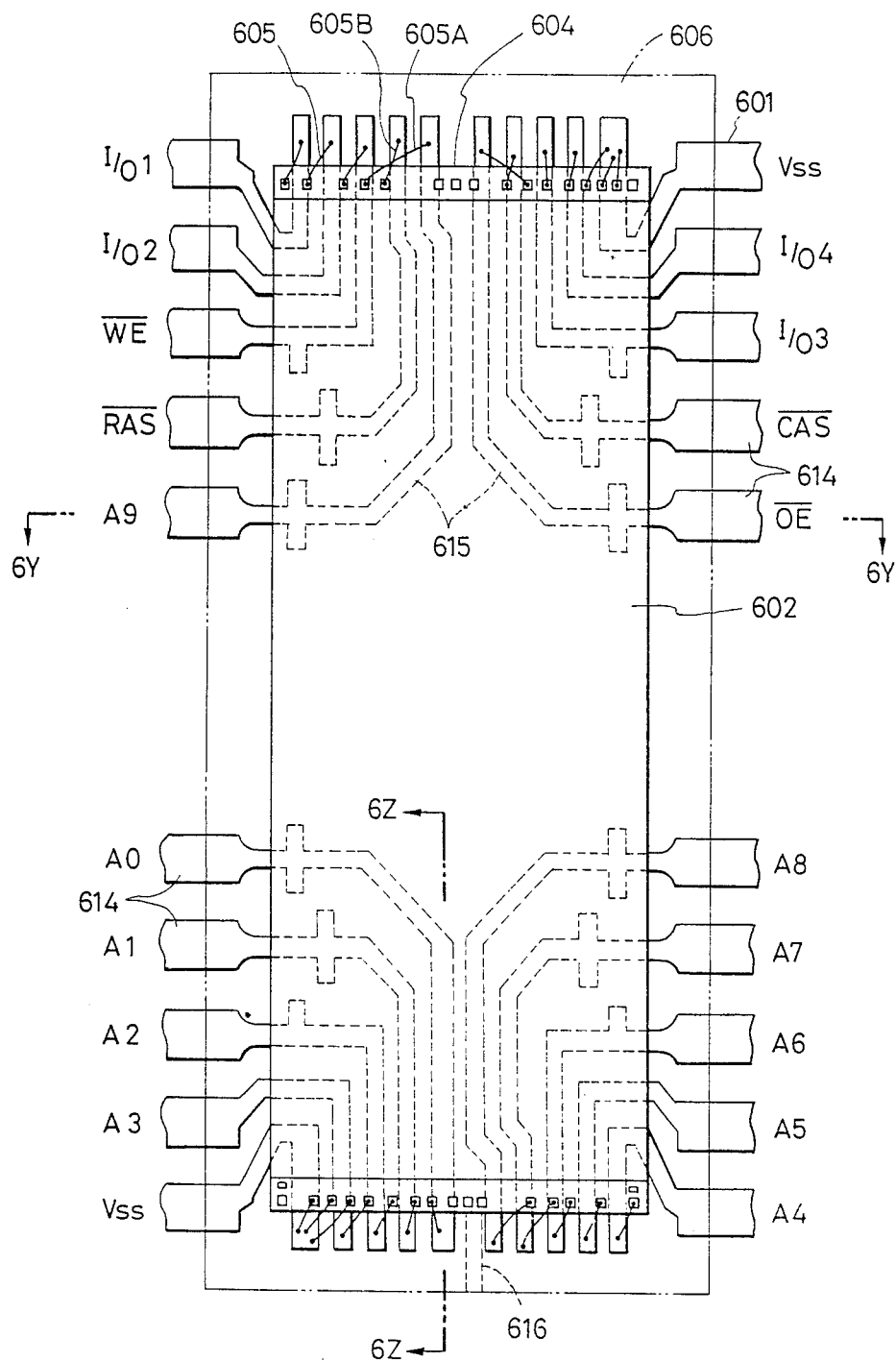
FIG. 6A is a plan view for explaining the structure of a resin-encapsulated semiconductor device inside the package thereof, the semiconductor device having the SOJ type package in the sixth embodiment of the present invention.
Figure 6B:
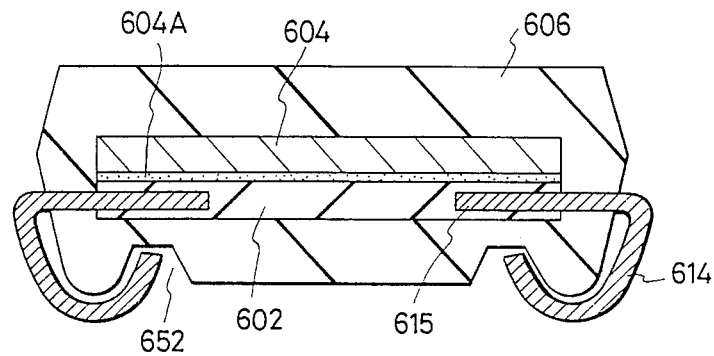
FIG. 6B is a sectional view taken along the line 6Y—6Y of a 4-megabit DRAM shown in FIG. 6A.
Figure 6C:
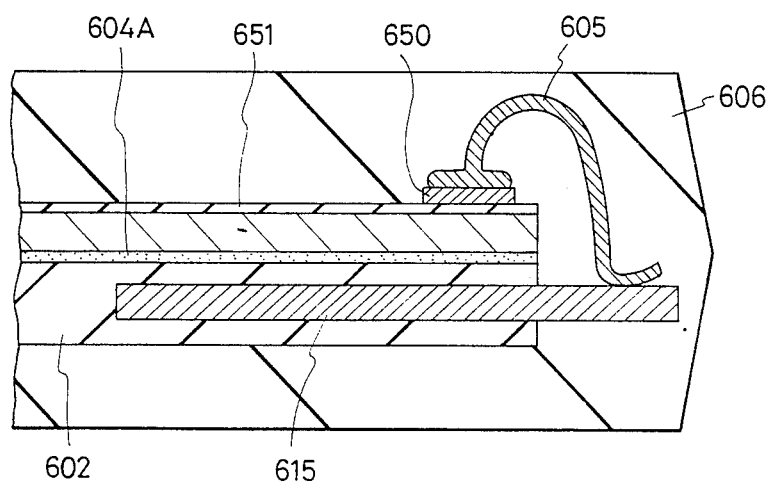
FIG. 6C is a sectional view taken along the line 6Z—6Z of a 4-megabit DRAM shown in FIG. 6A.

(6) Embodiment 6:

FIG. 6A is a plan view for explaining the structure of a resin-encapsulated semiconductor device inside the package thereof, in the sixth embodiment in which the present invention is applied to a 4- megabit dynamic random access memory (4M-DRAM) having the SOJ type package;

FIG. 6B is a sectional view taken along the line 6Y—6Y of the 4M-DRAM shown in FIG. 6A; and FIG. 6C is a sectional view taken along the line 6Z—6Z of the 4M-DRAM shown in FIG. 6A.

As shown in FIGS. 6A thru 6C, the resin-encapsulated semiconductor device of this embodiment in which the semiconductor chip of a 4M-DRAM is mounted in similar to Embodiment 4 in that an insulating resin plate (or layer) 602 is formed on the inner lead portions 615 of a tabless lead frame 601 by molding or the like, that the semiconductor chip 604 of the 4M-DRAM is fixed on the insulating plate 602 by a pellet-fixing thermosetting binder 604A with the rear surface thereof as a bonded surface, and that the inner lead portions 615 and the semiconductor chip 604 are electrically connected by pieces of bonding wire 605. Under this state, the resultant structure is encapsulated with a resin mold member 606. Thereafter, the outer lead portions 614 of the tabless lead frame 601 are worked into predetermined shapes. As the size of the package, the shorter sides thereof are 7.62 mm (300 mils) wide, and the longer sides thereof are 16.9 mm (675 mils) long.

As shown in FIG. 6A, the tabless lead frame 601 is made of a single plate of copper alloy or iron-nickel alloy (for example, 50% Ni—Fe) which is thin (for example, at a thickness of 0.25 mm).

Figure 6D:
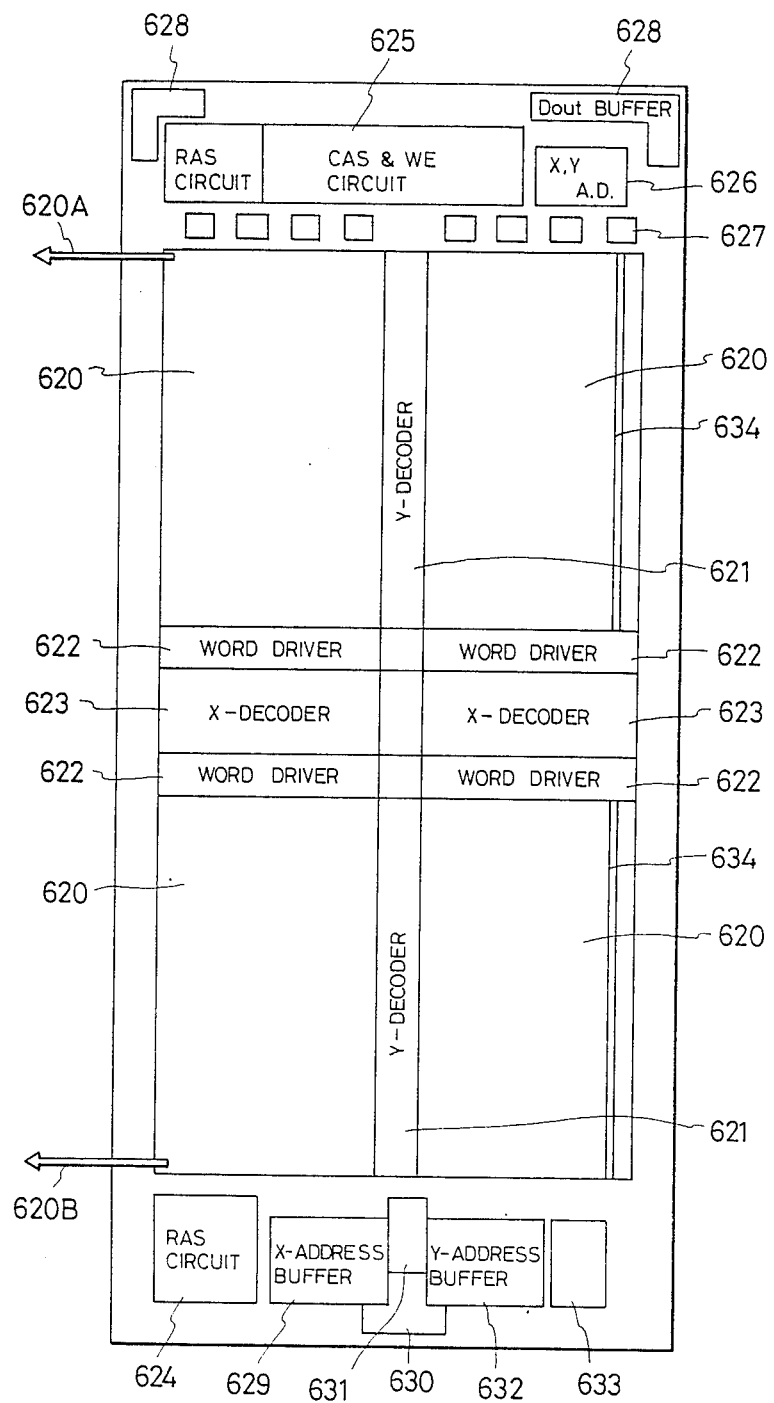
FIG. 6D is a plan view for explaining the layout of a semiconductor chip shown in FIG. 6A.

The semiconductor chip 604 includes the 4M-DRAM. As shown in FIG. 6D which is a plan view showing the circuit layout of the semiconductor chip, memory mats 602 are disposed in the central part of the semiconductor chip, Y-decoders 621 are disposed in parallel with a Y-axis and along the memory mats 620 in the X-directional central part thereof, and word drivers 622 and X-decoders 623 are disposed in parallel with an X-axis and along the memory mats 620 in the Y-directional central part thereof.

In one end part of the semiconductor chip in the longitudinal direction thereof, a RAS circuit 624, a CAS/WE circuit 625, and an address buffer 625 for X- and Y-addresses are disposed, main amplifiers 627 are disposed on the inner side of the end part, and $D_{out}$ buffers 628 are disposed at the corners of the end part. In the other end part of the semiconductor chip, there are disposed a RAS circuit 624, an X-address buffer 629, an X-generator 630, a Y-generator 631, a Y-address buffer 632, and an SHR/PC generator 633. Besides, in the right end part of the semiconductor chip in the lateral direction thereof, the common inputs/outputs and common sources 634 of the sense amplifiers are disposed, while in the left end part, the upper terminals 620A and lower terminals 620B of the memory mats 620 are respectively disposed at the upper end and lower end of this left end part.

Figure 6E:
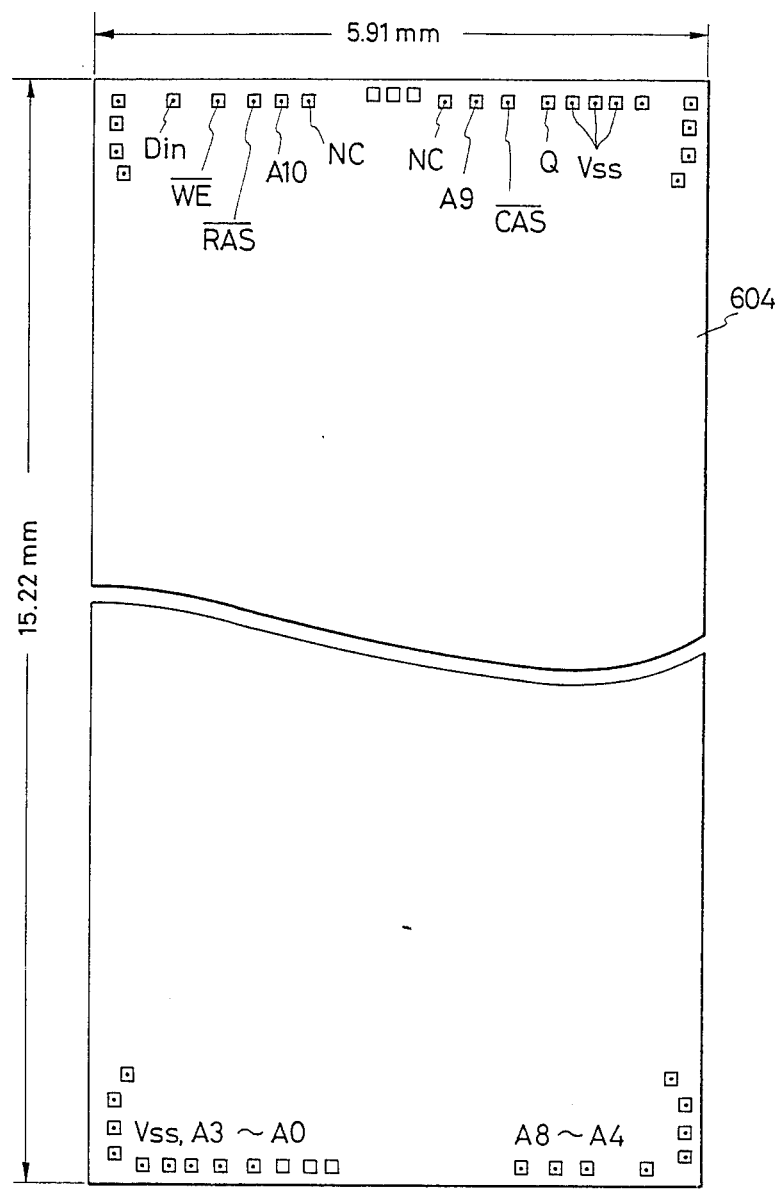
FIG. 6E is a plan view showing the arrangement of pads on the semiconductor chip shown in FIG. 6A.

As shown in FIG. 6E which is a plan view for explaining pads, the electrodes (pads) A1–A10, electrodes (pads) $D_{in}$, $\overline{WE}$, $\overline{RAS}$, NC, $V_{ss}$, Q ($D_{out}$) and $\overline{CAS}$, and electrodes (pads) P1–P3 of various elements included in the semiconductor chip 604 are disposed in both the end parts of the semiconductor chip 604 in the longitudinal direction thereof. The pads A0–A10 are pads for bonding signal lines, the pad $D_{in}$ is a pad for a data input signal, the pad $\overline{WE}$ is the pad of the $\overline{WE}$ signal of the $\overline{CAS/WE}$ circuit 625, the pad $\overline{RAS}$ is the pad of the $\overline{RAS}$ circuit 624, the pad $V_{ss}$ is a pad for a power source potential $V_{ss}$, pads I/01–I/04 are pads for the $D_{out}$ buffers 628, the pad $\overline{CAS}$ is the pad of the $\overline{CAS}$ circuit of the $\overline{CAS/WE}$ circuit 625, and the pads P1–P3 are probing pads.

The above pads are the corresponding inner lead portions are electrically connected by the pieces of bonding wire 605. In this regard, as illustrated in FIG. 6A, by way of example, a piece of bonding wire 605A for electrically connecting the pad $\overline{RAS}$ and the inner lead $\overline{RAS}$ is laid so as to intersect a piece of bonding wire 605B for electrically connecting the pad A9 and the inner lead A9. More specifically, the height of the loop of the piece of bonding wire 605B is made lower than that of the loop of the piece of bonding wire 605A so as to avoid short-circuiting.

Next, a process for assembling the resin-encapsulated semiconductor device of the present embodiment will be described.

As illustrated in FIGS. 6A thru 6C, the insulating plate 602 is formed by injection molding or the like under the state under which the inner lead portions 615 of the tabless lead frame 601 are sandwiched between the upper and lower split parts of a metal mold. The thickness of the insulating plate 602 is about 400 μm. The rear surface of the semiconductor chip 604 is fixed onto the insulating plate 602 by the thermosetting binder for pellet fixation 604A. By way of example, the pellet-fixing thermosetting binder 604A is a multilayer binder in which a nonconductive paste material, for example, silicone rubber, epoxy rubber, an epoxy type resin or a polyimide type resin is stacked on a thermosetting polyimide type resin binder of polypyromellitic imide, polyketone imide or the like.

Subsequently, the bonding terminal portions 615A of the respective inner lead portions 615 and corresponding pads 650 on the principal surface of the fixed semiconductor chip 604 are electrically connected by the pieces of bonding wire 605. The bonding wire 605 is, for example, gold (Au) wire having a diameter of 30 μm. As regards the wire bonding, by way of example, the pads A0-A10 on the semiconductor chip 604 and the pieces of bonding wire 605 are connected by wedge ball bonding. Likewise, the bonding terminal portions 615A of the inner lead portions 615 and the pieces of bonding wire 605 are connected by thermocompression combined with ultrasonic vibrations. The parts of the bonding terminal portions 615A of the inner lead portions 615 to be bonded are plated with silver (Ag). Besides, when the semiconductor chip 604 and the inner lead portions 615 are to be electrically connected by the bonding wire 605, the bonding position (two points) of each of the pads on the side of the semiconductor chip 604 is recognized to determine the coordinate thereof, and the wire bonding is automatically performed.

When the wire bonding has ended, the position of the gate 616 of the tabless lead frame 601 is registered with the injection port of the cavity of an apparatus for pouring the material of the resin mold member 606, and the material (an epoxy type resin or the like) is poured into the cavity so as to mold the above-stated structure. Thereafter, the outer lead portions 614 are worked into predetermined shapes. Then, the resin-encapsulated semiconductor device is finished up.

Here, the bonding of the wire is carried out by the known ball wedge thermocompression bonding lest a passivation film of PSG (phosphosilicate glass) or the like 651 under the pads (Al films) 650 should be damaged.

The outer lead portions 614 are so shaped that their fore ends turn toward the lower surface of the mold member 606 and enter the pocket parts 652 of the lower surface.

(7) Detailed Description of the Present Invention common to Embodiments 1-6:

The basic idea of the manufacturing technology of a resin-encapsulated IC employing a lead frame of the type stated before, which as no die pads, that is, in which die pads (support members for fastening a pellet thereon, and also called "tabs" in view of their shapes) cut out of a single metal sheet together with inner leads and outer leads are smaller than the pellet or are not existent at all (the lead frame has a large number of recurrent patterns, and can place a large number of IC pellets thereon), is described in U.S. patent application Ser. No. 845332 (filed Mar. 21, '86) or Japanese patent application Laid-open No. 218139/1986 by Okinaga et al. Therefore, the description of the preceding application shall be considered with the description of the present application.

Besides, an epoxy resin put into the insular structure of silicone, namely, a molding resin material consisting of 30% of silicone-modified epoxy resin and 70% of globular silica filler, a metal mold for a molding operation (also used for inner molding), etc., which are employed for the molding technology of the IC stated before, are described in Japanese patent application Publications Nos. 57347/1986, 26505/1985, 18145/1985 and 11973/1985 and Japanese patent application Laid-open No. 292330/1986. Therefore, the descriptions of these applications shall be considered with the description of the present application.

Further, the present invention utilizes ball wedge bonding, namely, wire bonding which employs an axially-symmetric capillary. Techniques concerning the bonding, especially a method of forming a ball at the end of a piece of wire, the details of the wire to be applied, a bonding apparatus, etc. are described in U.S. Pat. No. 4564734, U.S. patent application Ser. No. 036860 (filed Apr. 10, '87) or the official gazette of British Pat. Laid-open No. 2157607A, and U.S. patent application Ser. No. 067969 (filed June 29, '87) or the official gazettes of British Pat. Laid-open Nos. 2146937A and 2155036A. Therefore, the descriptions of these documents shall be considered with the description of the present application.

Still further, regarding the material of leads, the use of a copper-based alloy is appropriate in consideration of the merit of heat radiation. Such particulars are described in U.S. patent application Ser. No. 000175 (filed Jan. 2, '87) or Japanese patent application Laid-open No. 257160/1985, and the description shall be considered with that of the present application.

Yet further, flat packaging technology and packages for flat packaging such as an SOJ (Small Outline J-bend Package), SOP (Small Outline Package), QFP (Quad Flat Package), PLCC (Plastic Leaded Chip Carrier) and MSP (Mini Square Package) are described in U.S. patent application Ser. No. 843611 (filed Mar. 25, '86) or Japanese patent application Laid-open No. 218150/1986. Therefore, the description shall be considered with that of the present application.

In addition, the wafer processes and device structures of DRAM chips to be used in some of the foregoing embodiments are described in the official gazette of British Pat. Laid-open No. 2107114A. Therefore, the description of the official gazette shall be considered with that of the present application.

What is claimed is:

1. In a resin-encapsulated semiconductor device wherein a semiconductor pellet is fixed by die bonding to a pellet placing portion formed by a plurality of leads; a resin-encapsulated semiconductor device characterized in that said semiconductor pellet is fixed by die bonding to a resin mold piece which is formed so as to cover at least a front surface and both side surfaces of said each lead.

2. A resin-encapsulated semiconductor device as defined in claim 1, wherein said resin mold piece is a resin plate which is formed so as to cover all surfaces of said each lead.

3. In a semiconductor device wherein some of leads are extended under a chip, and the chip is supported on the leads through an insulating film; a semiconductor device characterized in that parts of said leads under said chip are buried in said insulating film.

4. A semiconductor device as claimed in claim 3, wherein said insulating film is made of polyimide.

5. A semiconductor device as defined in claim 3, wherein said chip is bonded on said insulating film by one selected from the group consisting of a thermoplastic resin and an Ag paste.

6. A semiconductor device as defined in claim 3, wherein said chip is bonded to said insulating film of polyimide before said insulating film is set by a heat treatment, and it is fastened by thermally setting said insulating film.

7. A semiconductor device as defined in claim 3, wherein said insulating film is provided so as to envelop the individual leads, and a radiator plate made of metal is interposed between said insulating film and said chip, whereby a heat radiation effect of said semiconductor device is raised.

8. A lead frame for a semiconductor device wherein a semiconductor chip is mounted on semiconductor chip placing parts of inner leads of a tabless lead frame, the inner leads in the semiconductor chip are electrically connected by pieces of bonding wire, and a resultant structure is encapsulated with a resin mold member; a lead frame wherein the semiconductor chip placing part of each inner lead is partially or wholly subjected to an insulating treatment, the partial or whole insulating treatment of said semiconductor chip placing part of said each inner chip is a treatment in which said semiconductor chip placing part is coated with an insulating substance including thermosetting polyimide type resin in a liquid state, whereupon said insulating substance is heated.

9. A lead frame as defined in claim 8, wherein the partial or whole insulating treatment of said semiconductor chip placing part of said each inner lead is a treatment in which said semiconductor chip placing part of said each inner lead is covered with an insulating substance such as thermosetting polyimide type resin in a tape shape, whereupon said insulating substance is heated.

10. A lead frame as defined in any of claims 8 thru 9, wherein said semiconductor chip is directly bonded to said semiconductor chip placing parts of said inner leads with a binder.

11. A lead frame as defined in claim 10, wherein said binder is a multilayer binder in which a thermoplastic binder, a thermosetting binder of polyimide type resin, and a thermosetting binder for pellet fixation are stacked in this order from a side of said inner leads.

12. A semiconductor integrated circuit device comprising:
  a semiconductor device having a front surface and a rear surface, said front surface including an integrated circuit and a plurality of bonding pads thereon;
  a plurality of inner leads including a chip mounting portion which is secured with said rear surface, said inner leads having a first surface which is opposed to said rear surface, a second surface opposing to said first surface and a third surface extending between said first and second surfaces;
  a plurality of wires electrically connecting between said pads and said inner leads respectively;
  a plurality of outer leads continuous to said inner leads respectively;
  an insulating means which is formed so as to cover at least said first and said third surfaces of said each inner leads; and
  an encapsulating means molding said chip, inner leads, wires and the insulating means therein;
  wherein said outer leads are protruded from said encapsulating means.

13. A semiconductor device according to claim 12, wherein the first surface of each inner lead faces toward the semiconductor pellet and the second surface of each inner lead is spaced from the first surface and is arranged parallel to the first surface.

14. A semiconductor device according to claim 12, wherein the insulating means is a resin plate and said encapsulating means is a resin mold member, said resin plate and said resin mold member being formed of the same resin material.

15. A semiconductor integrated circuit device according to claim 12, wherein said inner leads are protruded from side surfaces of a resin-molded assembly and are shaped so as to be suitable for flat packaging, the shape suitable for flat packaging being of SOJ (SMALL OUTLINE J-BEND PACKAGE) type.

16. A semiconductor integrated circuit device according to claim 15, wherein said said semiconductor device is a semiconductor chip and said chip is in the form of an oblong plate.

17. A semiconductor integrated circuit device as defined in claim 12, wherein said semiconductor device is a semiconductor chip and said chip is in the form of an oblong plate, and a large number of bonding pads is arranged near a pair of shorter sides of said oblong plate.

18. A semiconductor integrated circuit device as defined in claim 17, wherein said large number of inner leads enter under the rear surface of said chip from either of a pair of longer sides of said oblong plate and project out of said chip from either of said pair of shorter sides.

19. A semiconductor integrated circuit device as defined in claim 18, wherein said large number of inner leads are connected by the pieces of bonding wire with those corresponding bonding pads near the either shorter side to which inner ends of the respective inner leads are close.

20. A semiconductor device comprising:
  (a) an oblong and flat semiconductor chip which has first and second principal surfaces;
  (b) a very large number of elements which are formed on said first principal surface;
  (c) a large number of bonding pads which are provided near each of a pair of shorter sides on said first principal surface;
  (d) a large number of inner leads which extend substantially within a plane under and near said second principal surface and parallel to this principal surface,
    said inner leads including first, second, third and fourth sets each of which has a plurality of inner leads,
    said first set of inner leads entering under said chip from a first longer side of said chip, and projecting out of said chip from the first shorter side of said chip without intersecting any other inner lead, said second set of inner leads entering under said chip from said first longer side of said chip, and projecting out of said chip from the second shorter side of said chip without intersecting any other inner lead, said third set of inner leads entering under said chip from a second longer side of said chip, and projecting out of said chip from said first shorter side of said chip without intersecting any other inner lead, said fourth set of inner leads entering under said chip from said second longer side of said chip, and projecting out of said chip from said second shorter side of said chip without intersecting any other inner lead, said second principal surface of said chip and first principal surfaces of said inner leads being fastened through an insulating layer;

(e) a large number of pieces of bonding wire by which said large number of bonding pads near said first and second shorter sides and parts of said inner leads protruding from said first and second shorter sides are electrically connected near each of said first and second shorter sides;

(f) a resin mold member in which said chip, said inner leads and said pieces of bonding wire are substantially wholly molded, said mold member being substantially in a shape of a thick rectangular parallelepiped, and having first and second longer side surfaces, first and second shorter side surfaces, and first and second principal surfaces, said chip being buried in a substantially central part of said mold member in such a manner that said each longer side surface of said mold member and the corresponding longer side of said chip, said each shorter side surface of said mold member and the corresponding shorter side of said chip, and said each principal surface of said mold member and the corresponding principal surface of said chip form pairs and lie in parallel and in proximity, respectively;

(g) a first set of outer leads in a large number, which are respectively continuous to said first and second sets of inner leads at said first longer side surface of said mold member, and which protrude out; and (h) a second set of outer leads in a large number, which are respectively continuous to said third and fourth sets of inner leads at said second longer side surface of said mold member, and which protrude out, said first, second, third and fourth sets of inner leads and said first and second sets of outer leads being formed, in effect, of a single thin metal plate, said first set of outer leads having their protruding points from said first longer side surface arrayed substantially in a straight line in a longitudinal direction of said first longer side surface, said outer leads being bent substantially in arcs from their arrayed positions and along an outer surface of said mold member in such a manner that fore ends of said outer leads turn toward said second principal surface of said mold member near said first longer side surface, thereby permitting the resin-molded assembly to be flat-packaged at outer surfaces of lower parts of the arc-shaped outer leads, said second set of outer leads having their protruding points from said second longer side surface arrayed substantially in a straight line in a longitudinal direction of said second longer side surface, said outer leads being bent substantially in arcs from their arrayed positions and along an outer surface of said mold member in such a manner that fore ends of said outer leads turn toward said second principal surface of said mold member near said second longer side surface, thereby permitting the resin-molded assembly to be flat-packaged at outer surfaces of lower parts of the arc-shaped outer leads.

21. A semiconductor device comprising:
   a semiconductor pellet;
   a plurality of leads including a pellet mounting portion on which said pellet is mounted and each of said leads having a first surface which is opposed to said semiconductor pellet, a second surface opposing to said first surface and a third surface extending between said first and second surfaces;
   an insulating means which is formed so as to cover at least said first and said third surfaces of said each lead; and
   an encapsulating means molding said pellet, leads and the insulating means therein.

22. A semiconductor device according to claim 21, wherein said insulating means is a resin mold piece.

23. A semiconductor device according to claim 22, wherein said resin mold piece is a resin plate which is formed so as to cover said first, second and third surfaces of said each lead.

24. A semiconductor device according to claim 21, wherein said insulating means is made of film, a part of said leads are buried in said insulating film.

25. A semiconductor device according to claim 24, wherein said insulating film is made of polyamide.

26. A semiconductor device according to claim 21, further comprising:
   an adhering means disposed between said semiconductor pellet and said insulating means.

27. A semiconductor device according to claim 26, wherein said adhering means is made of a thermoplastic resin.

28. A semiconductor device according to claim 26, wherein said adhering means is made of an Ag paste.

29. A semiconductor device according to claim 21, further comprising:
   a heat radiating means made of metal which is interposed between said insulating film and said chip.

30. A semiconductor device according to claim 21, wherein the first surface of each lead faces toward the semiconductor pellet and the second surface of each lead is spaced from the first surface and is arranged parallel to the first surface.

31. A semiconductor device according to claim 21, wherein the insulating means is a resin plate and said encapsulating means is a resin mold member, said resin plate and said resin mold member being formed of the same resin material.

32. A lead frame for a semiconductor device comprising:
   a plurality of inner lead portions, semiconductor pellet supporting portions that are included within a part of said inner lead portions; and
   a plurality of outer lead portions, each of said outer lead portions extending from said inner lead portions continuously;

wherein said each inner and outer lead portions each have a first surface, a second surface opposing to said first surface and a third surface extending between said first and second surfaces,
and wherein an insulating means covers at least said first and said third surfaces of said pellet supporting portions.

33. A lead frame for semiconductor device according to claim 32:
wherein said insulating means is a thermosetting polyimide type resin.

34. A semiconductor device according to claim 32, wherein the first surface of each lead faces toward the semiconductor pellet and the second surface of each lead is spaced from the first surface and is arranged parallel to the first surface.

35. A semiconductor device according to claim 32, wherein the insulating means is a resin plate and said encapsulating means is a resin mold member, said resin plate and said resin mold member being formed of the same resin material.

* * * * *